(12) United States Patent
Van Endert

(10) Patent No.: US 8,212,500 B2
(45) Date of Patent: Jul. 3, 2012

(54) SYSTEM FOR CONTROLLING LIGHT IN DEPENDENCE OF TIME-OF-FLIGHT SIGNAL

(75) Inventor: Tony Petrus Van Endert, Taipei (TW)

(73) Assignee: Lite-On It Corporation, Taipei (TW)

( * ) Notice: Subject to any disclaimer, the term of this patent is extended or adjusted under 35 U.S.C. 154(b) by 289 days.

(21) Appl. No.: 12/739,772

(22) PCT Filed: Oct. 26, 2007

(86) PCT No.: PCT/CN2007/003057
§ 371 (c)(1), (2), (4) Date: Apr. 26, 2010

(87) PCT Pub. No.: WO2009/052660
PCT Pub. Date: Apr. 30, 2009

(65) Prior Publication Data
US 2010/0253241 A1    Oct. 7, 2010

(51) Int. Cl.
*H05B 37/02* (2006.01)
(52) U.S. Cl. ......... 315/360; 315/246; 315/267; 315/308
(58) Field of Classification Search .................. 315/246, 315/267, 291, 308, 360; 700/306
See application file for complete search history.

(56) References Cited

U.S. PATENT DOCUMENTS

| | | | |
|---|---|---|---|
| 6,198,230 B1 * | 3/2001 | Leeb et al. | 315/224 |
| 6,211,626 B1 * | 4/2001 | Lys et al. | 315/291 |
| 6,263,260 B1 | 7/2001 | Bodmer et al. | |
| 6,426,599 B1 * | 7/2002 | Leeb | 315/224 |
| 6,794,831 B2 * | 9/2004 | Leeb et al. | 315/307 |
| 7,453,217 B2 * | 11/2008 | Lys et al. | 315/291 |
| 2010/0327766 A1 * | 12/2010 | Recker et al. | 315/291 |

FOREIGN PATENT DOCUMENTS

| | | |
|---|---|---|
| CN | 1874640 A | 12/2006 |
| DE | 102 42 890 | 3/2004 |
| JP | 8286287 A | 11/1996 |
| JP | 2002190398 A | 7/2002 |
| JP | 2007265702 A | 10/2007 |

(Continued)

OTHER PUBLICATIONS

International Search Report and Written Opinion, dated Jul. 24, 2008.

(Continued)

*Primary Examiner* — Thuy Vinh Tran
(74) *Attorney, Agent, or Firm* — Thomas|Kayden

(57) ABSTRACT

A lighting system comprising a lamp comprising an array of LEDs arranged to transform electricity into a light beam having properties including intensity, color, color temperature; a fight control system comprising a LED driver and a pulse width modulator arranged to adjust said light beam properties; a DA-converter, an ultrasound driver and an ultrasonic transmitter arranged to convert a digital transmit signal into the transmission of an ultrasonic pulse; an ultrasonic receiver and an amplifier arranged to receive reflected ultrasonic signals and transform said ultrasonic signal in a voltage, and a comparator arranged to generate a digital receive signal if said voltage is greater than a predetermined threshold; a processing system arranged to derive a time-of-flight signal representing the time differences between said digital transmit and receive signals and to send control signals to said light control system in dependence of said time-of-flight signal.

6 Claims, 32 Drawing Sheets

FOREIGN PATENT DOCUMENTS

| | | |
|---|---|---|
| WO | WO 2004/039631 | 5/2004 |
| WO | WO 2006/056814 | 6/2006 |

OTHER PUBLICATIONS

European Search Report dated Feb. 21, 2012.

English language translation of abstract of DE 102 42 890 (published May 13, 2004).

English language translation of abstract of WO 2004/039631 (p. 1 of publication, published May 13, 2004).

\* cited by examiner

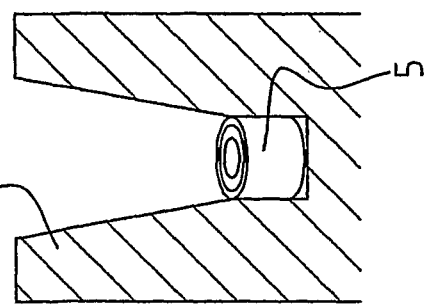
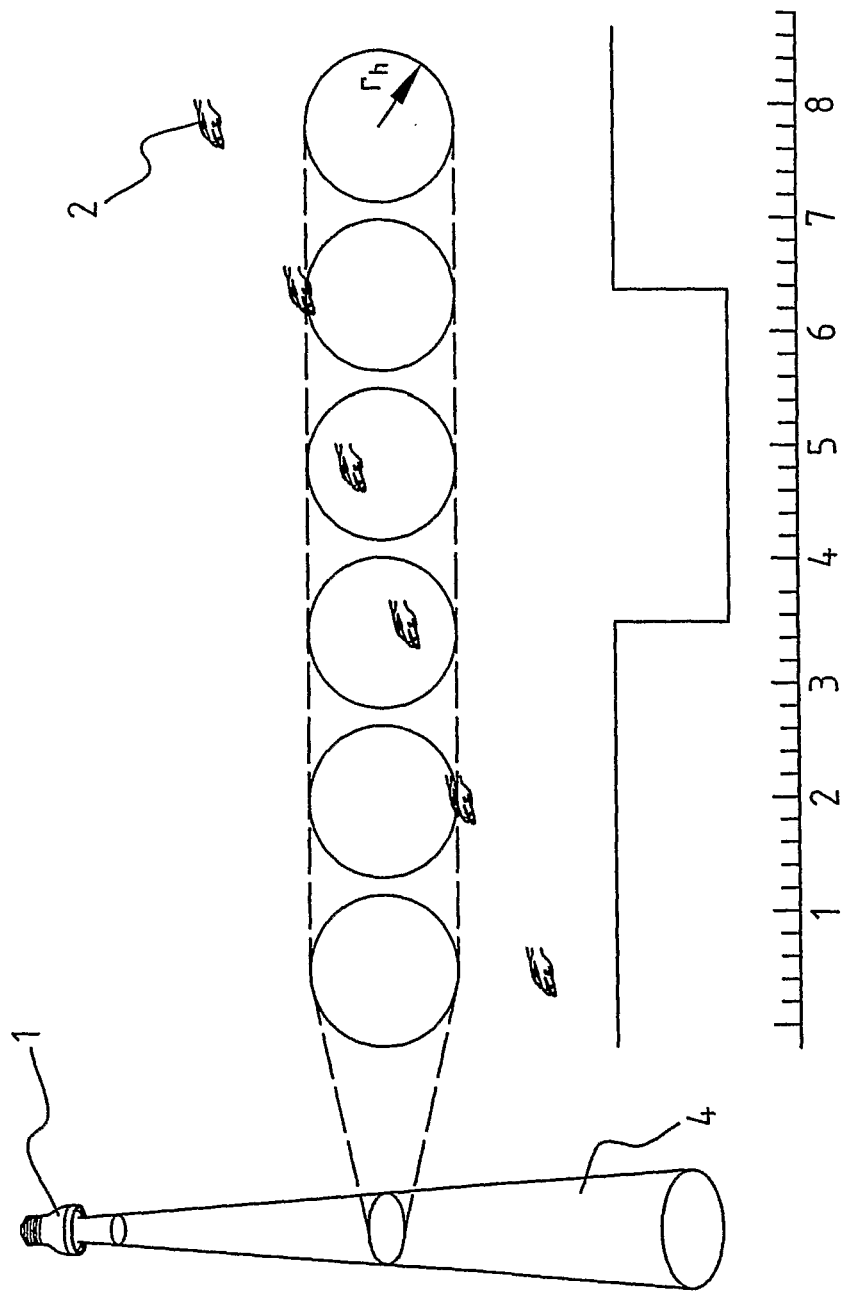
FIG. 8
FIG. 7

SYSTEM FOR CONTROLLING LIGHT IN DEPENDENCE OF TIME-OF-FLIGHT SIGNAL

CROSS REFERENCE TO RELATED APPLICATION

This application is the 35 U.S.C. §371 national stage of PCT application PCT/CN2007/003057, filed Oct. 26, 2007, the disclosure of which is hereby incorporated by reference.

FIELD OF THE INVENTION

The invention relates to a lighting system comprising a lamp arranged to transform electricity into a light beam having properties such as intensity, colour, colour temperature, direction and beam cone angle, and a light control means arranged to adjust said light beam properties.

BACKGROUND OF THE INVENTION

Adjustment of a lamp's properties is well known to be achieved via a remote control (RC). A disadvantage of a remote control is the necessity of the presence of the remote control on the right location at a random moment. Also a lot of different remote controls are already present in the living room for TV, audio, VCR, CD/DVD player/recorder, etc.. Further, the different buttons on a remote control can be confusing to the user. Finally, the costs of a remote control and the accompanying receiver are relatively high.

Also control of electrical devices by the use of video cameras and movement detection software is known, wherein the user can control the electrical device by making gestures in front of the camera. Such systems require heavy duty processing power, have a relatively long response time, and are relatively expensive.

WO 2006/056814 describes a lighting system comprising a lamp and a control means comprising an infrared transmitter, an infrared receiver and a lens arrangement. The control means measure the intensity of the reflected infrared light, and changes the lamp brightness in reaction thereto. In this manner the lamp can be switched on and off, and can be dimmed by hand movements in the infrared beam. Such an arrangement is however relatively expensive and inaccurate, as the intensity of the reflected infrared signal heavily depends on the kind of object that is moved in the beam.

It is a goal of the invention to provide an improved, cheap, reliable and easy-to-use control system for lighting. A further goal of the invention is to provide a lighting system that is safe and comfortable for its users and their environment.

SUMMARY OF THE INVENTION

According to the invention the lighting system further comprises an ultrasonic transmitter arranged to transmit ultrasonic signals, an ultrasonic receiver arranged to receive reflected ultrasonic signals, and a processing means arranged to derive a time-of-flight signal representing the time differences between said transmitted and received ultrasonic signals and to send control signals, for instance binary code, to said light control means in dependence of said time-of-flight signal. Thereby a user of the system can adjust the lamp properties by moving an object, such as his hand, in the ultrasonic beam.

The ultrasonic transmitter may for instance emit sound at a frequency of 40 kHz. Although alternatives to the use of ultrasonic transmitters/receivers, such as for instance infrared or radar transmitters/receivers would be capable of measuring the time-of-flight of the respective signals, ultrasound is in particular suitable for the present application, since the time-of-flight (where the typical distance is between 0.2 and 2 meter) can be measured in milliseconds rather than in nanoseconds, which allows for easy and accurate measurement with low cost processing equipment. The system of the invention can be produced at very low cost, since piezoelectric acoustic transducers are very cheap.

GB-A-2 291 289 describes a lighting system comprising a control means for switching a lamp on and off and for dimming the lamp, wherein piezoelectric ultrasonic transmitters and receivers are used to detect the presence of an object in the vicinity of the lamp, and said control means is arranged to react to the presence of said object. This system does however not use time-of-flight measurements of the ultrasonic signal, and thereby is not able to react to movement of the object.

The system of the invention is easy to control, with a simple user interface which does not require additional equipment such as a remote control. Other qualities of the system of the invention are its robustness, its independency from environmental conditions, its one-dimensional recognition of control movements, and its low processing power requirements. The further advantage of an ultrasound sensor is that it is less influenced by changing ambient light, temperature and humidity conditions.

The processing means is preferably arranged to analyse the dynamic behaviour of said time-of-flight signals and to send control signals to said light control means in dependence of said dynamic behaviour. Thereby the user can make gestures in the ultrasonic beam that will be recognised by the processing means and translated into control signals.

Said processing means is preferably arranged to stop sending control signals if said time-of-flight signal changed from dynamic behaviour to a value that has been substantially constant for a first predetermined period of time, said first predetermined period of time preferably being in the range of 0.5-2 s. By switching off the sending of control signals it is possible to prevent accidental adjustment of the lamp properties by a moving object. In order to turn the sending of control signals on, said processing means is further preferably arranged to determine and store a highest reference value, which reference value is determined as the value that has been present during most of a second predetermined longer period of time of for instance several minutes, and said processing means is then further arranged to start sending control signals if said time-of-flight signal changed from said highest reference value to a lower value that has been substantially constant for at least a shorter third predetermined period of time, said third predetermined period of time preferably being in the range of 0.5-2 s.

In the preferred embodiment said lamp is a spotlight type lamp arranged to emit a light beam having a beam cone angle θ smaller than 45°, preferably smaller than 30°. Said beam cone angle of the transmitted ultrasonic signals is preferably smaller than 15°. To that end said ultrasonic transmitter may comprise a horn for reducing the beam cone angle of the transmitted ultrasonic signals.

In the preferred embodiment said ultrasonic transmitter and receiver are arranged to transmit and receive ultrasonic signals in a direction extending within the light beam of the lamp. The light source of said lamp is preferably a plurality of LEDs, wherein said ultrasonic transmitter and receiver preferably extend substantially between said plurality of LEDs.

Said ultrasonic transmitter and receiver, processing means, and/or light control means, preferably extend in the lamp housing, and said ultrasonic transmitter and receiver preferably are a combined ultrasonic transducer. Thereby a compact and easy to install lighting system is provided, that is intuitively controlled by moving one's hand in the centre of the light beam. The invention also relates to a single lamp unit comprising the entire lighting system as described above.

According to a further aspect of the invention, in order to adjust the sound pressure of the ultrasonic transmitter to an acceptable, un-harmful and comfortable level for the users of the lighting system and their environment, said processing means is further arranged to perform a sound pressure level calibration step wherein the amplitude of the received reflected ultrasonic signal of the receiver is measured and wherein the amplitude of the transmitted ultrasonic signal of the transmitter is adjusted such that the amplitude of the received reflected signal approximates a predetermined threshold value. The amplitude of the received reflected ultrasonic signal in a certain situation depends on the transmitted amplitude, the distance-of-travel, the environmental absorption (e.g. absorption of ultrasound by air), and the diffraction by the reflecting reference surface (e.g. a fixed table, floor, etc.). In a certain situation for the period that the lamp is switched on it can be assumed that the absorption and diffraction are either constant if no object moves into the ultrasonic beam, or that the received amplitude will increase because the reflecting object is closer to the ultrasonic receiver, and therefore after calibration the transmitted amplitude can remain constant while it is more or less ensured that the received signal is always higher than the required threshold. In case however that after calibration the lighting system does (sometimes) not react to control gestures of the user, the user can be instructed to calibrate the system while holding the control object (f.i. his hand) at the farthest point he is expecting to put said object for controlling the system.

The transmitted and received sound pressure levels are measured in dB, but can be represented by a voltage, for instance the voltage put on the ultrasonic transmitter or the voltage received from the ultrasonic receiver. The maximum permissible exposure to 40 kHz ultrasound for instance is set by various organisations around 100 dB. The invention aims however at much lower levels than this, and will adjust the pressure level to a minimum, yet optimum level.

In order to further reduce the influence of the acoustic pressure on the users, the system is arranged to transmit said ultrasonic signals intermittently in short (preferably max. 100 ms) intervals.

Said processing means is preferably arranged to perform said sound pressure level calibration step in a short period, for instance within the first few seconds, after the lamp is switched on. Further said processing means is preferably arranged to start deriving said time-of-flight signal and sending control signals after said sound pressure level calibration step. Furthermore preferably said processing means is arranged to repeatedly perform said sound pressure level calibration step while it is deriving said time-of-flight signals and is sending said control signals to said light control means. Thereby a dynamic calibration of the sound pressure level to the lowest level that is necessary to operate the system is achieved.

In order to achieve the minimum necessary sound pressure level for the system to work properly, said processing means is preferably arranged to start said sound pressure level calibration step with a first calibration cycle wherein the ultrasonic transmitter is caused to send an ultrasonic pulse with a predetermined lowest amplitude and wherein the amplitude of the received reflected signal is measured, and to repeat said calibration cycle with a transmitted amplitude that is increased in each subsequent cycle with a predetermined value as often as necessary until the amplitude of the received reflected signal is equal to or higher than said predetermined threshold value. Said processing means is preferably arranged to cause a warning signal to be emitted by said lighting system, for instance a flickering of said lamp, if the amplitude of the received reflected signal is lower than said predetermined threshold value after a predetermined maximum number of calibration cycles.

There are several issues related to the robustness and reliability of a gesture light control system based on ultrasound. Reflections, diffraction, interference, noise may disturb the received signal. Other issues like a moved reference surface, other moving objects, multiple objects should be dealt with.

According to a further aspect of the invention, in order to provide a robust and reliable system, said processing means is further arranged to perform a reference calibration step, wherein the time-of-flight (TOF) is repeatedly measured a multitude of times, and wherein the processing means determines if the deviation of the majority of the measured time-of-flight values (TOFI) of said multitude of measurements is lower than a predetermined threshold (z), and wherein said processing means is arranged to calculate the average (TOFREF) of said measured time-of-flight values (TOFI) and store said average (TOFREF) in memory means as a reference time-of-flight value if said deviation is lower than said threshold (z). Said processing means is preferably arranged to generate an error signal if said deviation is not lower than said threshold (z).

Preferably said processing means is arranged to store said reference time-of-flight value (TOFREF) in said memory means only if said reference time-of-flight value (TOFREF) is greater than a predetermined minimum value. Said processing means is preferably arranged to generate an error signal if said reference time-of-flight value (TOFREF) is not greater than said predetermined minimum value.

Preferably said processing means is arranged not to store a reference time-of-flight value (TOFREF) in said memory means if during said reference calibration step no signal is received by said ultrasonic receiver during at least a predetermined number of time-of-flight measurements. Said processing means is preferably arranged to generate an error signal if during said reference calibration step no signal is received by said ultrasonic receiver during at least said predetermined number of time-of-flight measurements.

According to a further aspect of the invention, in order to provide a robust and reliable system, said processing means is arranged to perform a wait-for-control-enablement cycle wherein said time-of-flight (TOF) is repeatedly measured at predetermined intervals and to compare said measured time-of-flight value (TOF) with a reference time-of-flight value (TOFREF) which is stored in memory during said wait-for-control cycle, and to repeat said measurement if said measured time-of-flight value (TOF) is equal to or larger than said reference time-of-flight value (TOFREF), said processing means is further arranged to determine if the measured time-of-flight value (TOF) is smaller than said reference time-of-flight value (TOFREF) and if the deviation between the measured time-of-flight value (TOFH) and the previous measured time-of-flight value (TOFH-1) is lower than a predetermined threshold (tx), and said processing means is arranged to send control signals to said light control means in dependence of time-of-flight signals derived after it is determined that the measured time-of-flight value (TOF) is smaller than said reference time-of-flight value (TOFREF) and that said deviation is lower than said threshold (tx) for a predetermined number of repeated measurements.

Said predetermined interval is preferably substantially larger if it is determined that said measured time-of-flight value (TOF) is equal to or larger than said reference time-of-flight value (TOFREF), than if it is determined that said measured time-of-flight value (TOF) is smaller than said reference time-of-flight value (TOFREF).

Preferably said processing means is arranged to calculate the average of said measured time-of-flight values (TOF) and to store said average (TOFH) in memory means, and the processing means is arranged to send control signals to said light control means in dependence on the positive or negative difference between the measured time-of-flight (TOF) and said average time-of-flight (TOFH) after it is determined that said deviation is lower than said threshold (tx) for a predetermined number of repeated measurements.

Preferably said processing means is further arranged to clip the difference of the measured time-of-flight value (TOF) to a maximum allowed positive or negative difference between the measured time-of-flight (TOF) and said average time-of-flight (TOFH) for the purpose of determining the control signals to be sent to the light control means.

Preferably said processing means is further arranged to calculate said maximum allowed positive and negative difference such that the negative difference is smaller than said average time-of-flight (TOFH), and that the positive difference is smaller than the difference between said reference time-of-flight (TOFREF) and said average time-of-flight (TOFH).

Preferably said processing means is further arranged to adapt the determination of the control signals to be sent to the light control means such, that the full range of control signal can be achieved within the calculated range of the maximum allowed positive and negative difference.

According to a further aspect of the invention, in order to be able to adjust different light beam properties, said processing means and said light control means are further arranged to change from adjustment of one of said light beam properties to adjustment of another one of said light beam properties, if a predetermined behaviour in said time-of-flight signal is determined.

In a preferred embodiment said behaviour is a series of subsequently measured time-of-flight values that is substantially constant during a predetermined period.

In a further preferred embodiment said behaviour is a predetermined number of alternations of high and low measured time-of-flight values.

In a still further preferred embodiment said behaviour is a predetermined number of alternations of the presence and absence of measured time-of-flight values.

In a remote controlled lighting system it is desirable to provide feedback about the status and working of the system to the user in an efficient and low-cost manner.

The invention therefore further relates to a lighting system comprising a lamp arranged to transform electricity into a light beam having properties such as intensity, colour, colour temperature, direction and beam cone angle; a light control means arranged to adjust said light beam properties; a processing means arranged to send control signals to said light control means; a user control interface arranged to transform user control input into electronic input signals and to send those electronic input signals to said processing means; wherein said processing means is arranged to send a user feedback signal to said light control means such that said lamp properties either alternate in time or are different in adjacent locations, such that a user can recognize said alternating or adjacent different light properties as a feed back signal.

Preferably said processing means is arranged to send said user feedback signal to said light control means for a short period of time, for instance 0.2-5 seconds, and to send subsequently a signal to said light control means such that said lamp properties return back to the previous state or are set to a predefined steady state such as the switched off state.

In a preferred embodiment said feedback signal is such that the lamp intensity is visibly changed at least twice within said short period of time.

In a further preferred embodiment said feedback signal is such that the colour temperature is visibly changed at least twice within said short period of time.

In a still further preferred embodiments said lamp comprises an array of LEDs, wherein said light control means is arranged to individually power said LEDs in said LED array, and wherein said feedback signal is such that a visible sign such as a letter or an icon is formed in said array during said short period of time. Preferably said lamp comprises a lens to project said LED array on a reference surface. Said lens is preferably adjustably mounted in said lamp such that it is adjustable in dependence of the measured distance between the lamp and the reference surface.

In the preferred embodiment said user control interface comprises an ultrasonic transmitter arranged to transmit ultrasonic signals; an ultrasonic receiver arranged to receive reflected ultrasonic signals; wherein said processing means is arranged to derive a time-of-flight signal representing the time differences between said transmitted and received ultrasonic signals and to send control signals to said light control means in dependence of said time-of-flight signal. Said ultrasonic transmitter and/or receiver is preferably built-in in the centre of the lens.

It is desirable that the ultrasound controlled lighting system is easy to produce in mass quantities, with low cost components, and has small dimensions so that it can be built-in in even in a small lamp.

The invention therefore further relates to a lighting system comprising a lamp comprising an array of LEDs arranged to transform electricity into a light beam having properties such as intensity, colour, colour temperature; a light control means comprising a LED driver and a pulse width modulator arranged to adjust said light beam properties; a DA-converter, an ultrasound driver and an ultrasonic transmitter arranged to convert a digital transmit signal into the transmission of an ultrasonic pulse; an ultrasonic receiver and an amplifier arranged to receive reflected ultrasonic signals and transform said ultrasonic signal in a voltage, and a comparator arranged to generate a digital receive signal if said voltage is greater than a predetermined threshold; a processing means arranged to derive a time-of-flight signal representing the time differences between said digital transmit and receive signals and to send control signals to said light control means in dependence of said time-of-flight signal, wherein said processing means, said pulse width modulator, said DA-converter and said comparator are integrated in a single microcontroller chip.

Said microcontroller chip is preferably chosen from the single-chip 8-bit 8051/80C51 microcontroller family, preferably comprising small sized RAM and ROM, preferably smaller than 4 kB ROM and smaller than 512 B RAM.

Preferably said ultrasonic transmitter and said ultrasonic receiver are integrated in a piezoelectric ultrasound transducer.

Preferably said transmitting ultrasound driver and said receiving ultrasound amplifier are integrated in a pre-processing circuit. Said pre-processing circuit preferably further comprises a second order filter for filtering out low frequent signals from said received signal.

BRIEF DESCRIPTION OF THE DRAWINGS

The invention will be further explained by means of a preferred embodiment as shown in the accompanying drawings, wherein:

FIG. 7 shows schematically the movement of a hand in and out of the beam and the related graph of the time-of-flight against time;

FIG. 8 is a schematic cross-sectional view of an ultrasonic transducer and a horn;

DETAILED DESCRIPTION OF THE PREFERRED EMBODIMENTS

Figure 2:
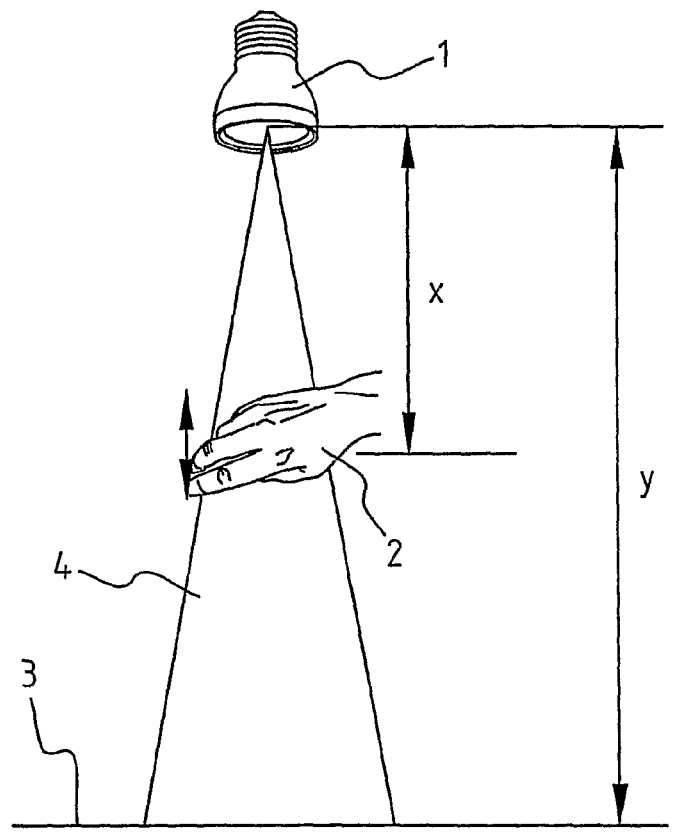
FIG. 2 is a schematic perspective view of the lamp and its control mechanism.

The lamp 1 as shown in FIG. 2 comprises a plurality of LEDs and an ultrasonic transceiver built-in in the centre of said plurality of LEDs. Also a processing means for translating the signals of the transceiver into control signals, and control means to adjust the light properties are built-in.

If the ultrasonic transceiver is switched on it will send an acoustic signal. If an object is present the acoustic signal will be reflected at the object and will be received by the ultrasonic transceiver inside the lamp. The time difference, called the time-of-flight, between sending and receiving the acoustic signal will be measured. If the distance between the object and the lamp 1 is changed another time-of-flight value will be measured. The detected movement of the object is a one-dimensional movement (the object must stay in the ultrasound beam cone). The change in time-of-flight will be translated into a change in a digital control signal. This control signal will control the properties of the light beam, like colour, intensity or colour temperature, etc.

The object may be the hand 2 of a user. Thus a one-dimensional movement of the hand 2, like up/down or left/right direction (depending on lamp position, horizontal or vertical) can control the light beam properties.

In commercially available pulse echo distance measurement units of the transmitter—reflector—receiver type (TRR), the most common task is to measure the distance to the closest reflecting object. The measured time is the representative of travelling twice the distance. The returned signal follows essentially the same path back to a receiver located close to the transmitter. Transmitting and receiving transducers are located in the same device. The receiver amplifier sends these reflected signals (echoes) to the micro-controller which times them to determine how far away the object is, by using the speed of sound in air.

Figure 1:
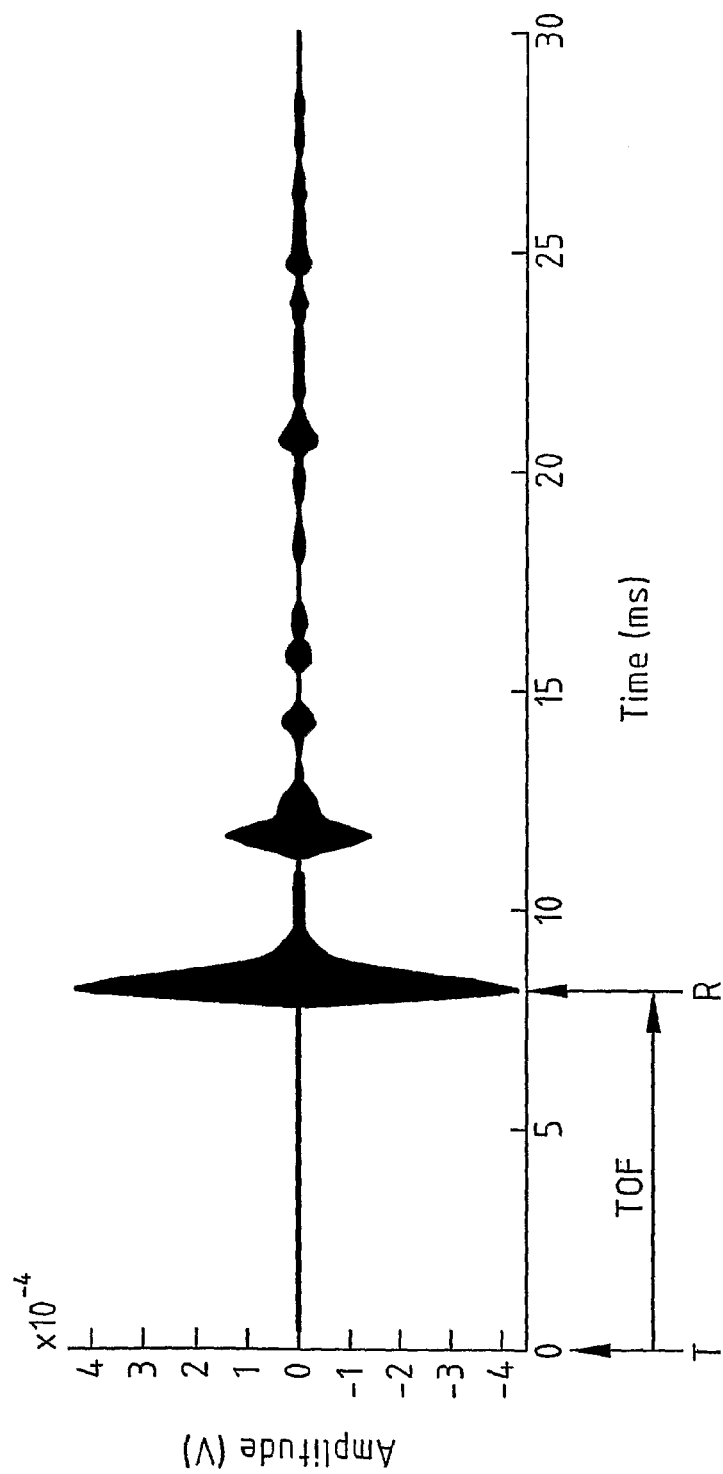
FIG. 1 is a graph showing the principle of time-of-flight measurement with an ultrasonic transceiver.

The time-of-flight of acoustic signals is commonly used as a distance measurement method. A time-of-flight measurement, as illustrated in FIG. 1 is formed by subtracting the time-of-transmission (T in FIG. 1) of a signal from the measured time-of-receipt (R in FIG. 1). This time distance information will be transferred into a binary code in the microprocessor to control the lamp properties.

In FIG. 2 a hand 2 is the obstacle/object and a table 3, floor or ceiling is the reference. The ultrasonic transducer sends an ultrasonic wave in the form of a beam cone 4. If the distance y from the transducer to the reference is 1.5 m, the total travel distance for the ultra-sound beam 4 is 2*y=3 m. The time-of-flight then is 8.7 ms (at an ambient temperature of 25° C.). If the distance x from the transducer to the hand is 0.5 m, the time-of-flight is 2.9 ms. If the required accuracy of control steps of the hand movement is 2 cm (time-of-flight steps of 0.12 ms), and the range of control is for instance 64 cm, there are 32 control steps, which allows for 5-bit control.

Figure 3:
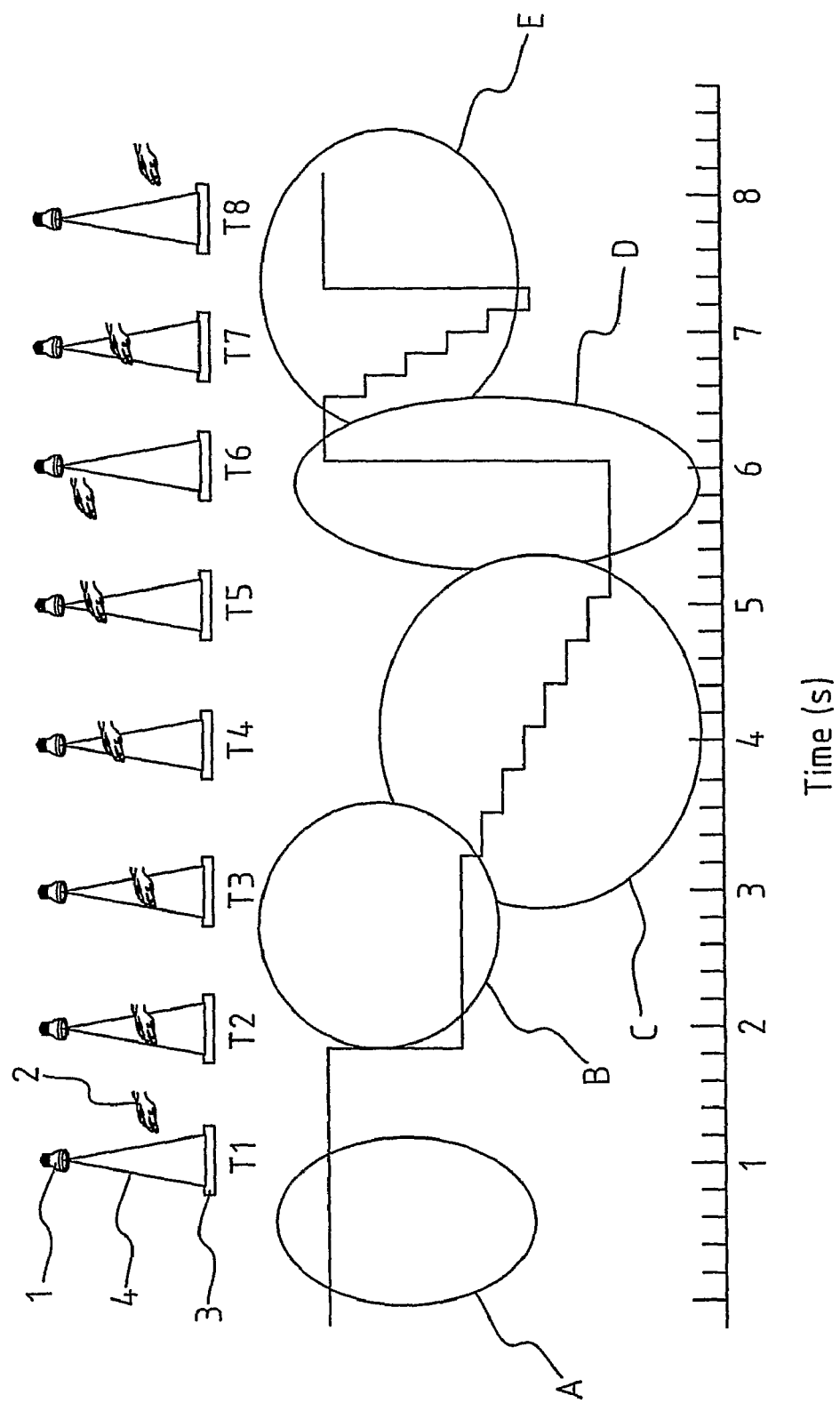
FIG. 3 is a combined drawing showing stills of hand movements in the system of FIG. 2 and a graph showing the time-of-flight signal against time, and various stages of lamp property control caused by said hand movements.

The control signal as shown in FIG. 3 is made by the movement of the hand 2 in a one-dimensional vertical direction in the ultrasonic beam 4. At T1=1 s the hand 2 is outside the beam, the reference value is measured, and lamp control is disabled (stage A). At T2=2 s the hand 2 moves into the beam 4 and is held there for more than 1 second until at T3=3 s lamp control is enabled by the microcontroller (stage B). Then the hand 2 moves up between T3=3 s and T5=5 s, whereby for instance the intensity of the lamp 1 is increased by the microprocessor (stage C). At T6=6 s the hand is withdrawn from the beam 4 so that the reference value is measured, and lamp control is disabled thereby (stage D). An accidental movement of the hand 2 in the ultrasonic beam 4 as shown at T7=7 s does therefore not result in an accidental adjustment of the lamp properties (stage E). Hence, the lamp control is activated by holding an object in the ultrasonic beam 4 for more than 1 second.

Figure 4:
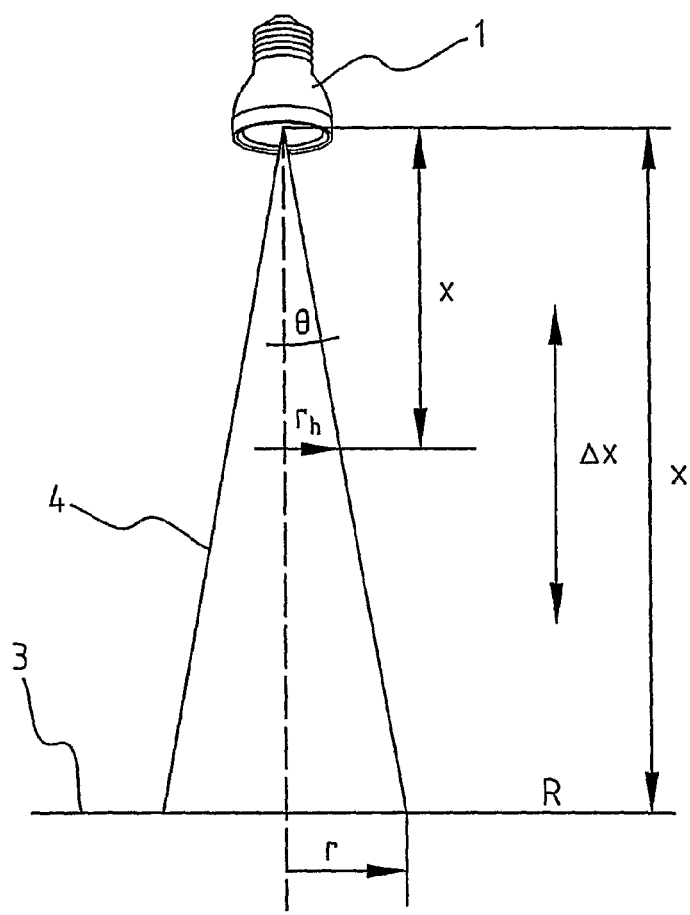
FIG. 4 is a schematic perspective view of the lamp of FIG. 2.
Figure 5:
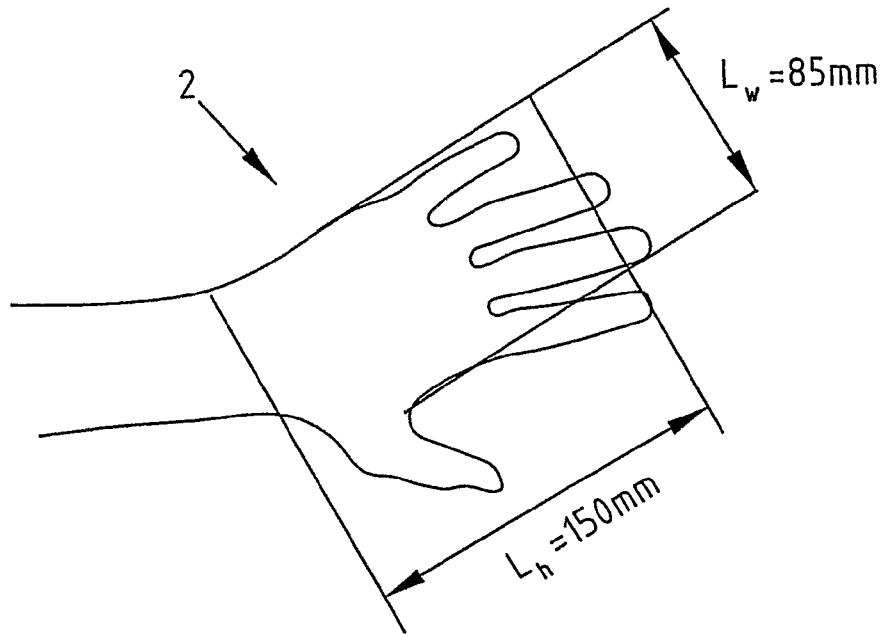
FIG. 5 is a schematic top view of an average hand.
Figure 6:
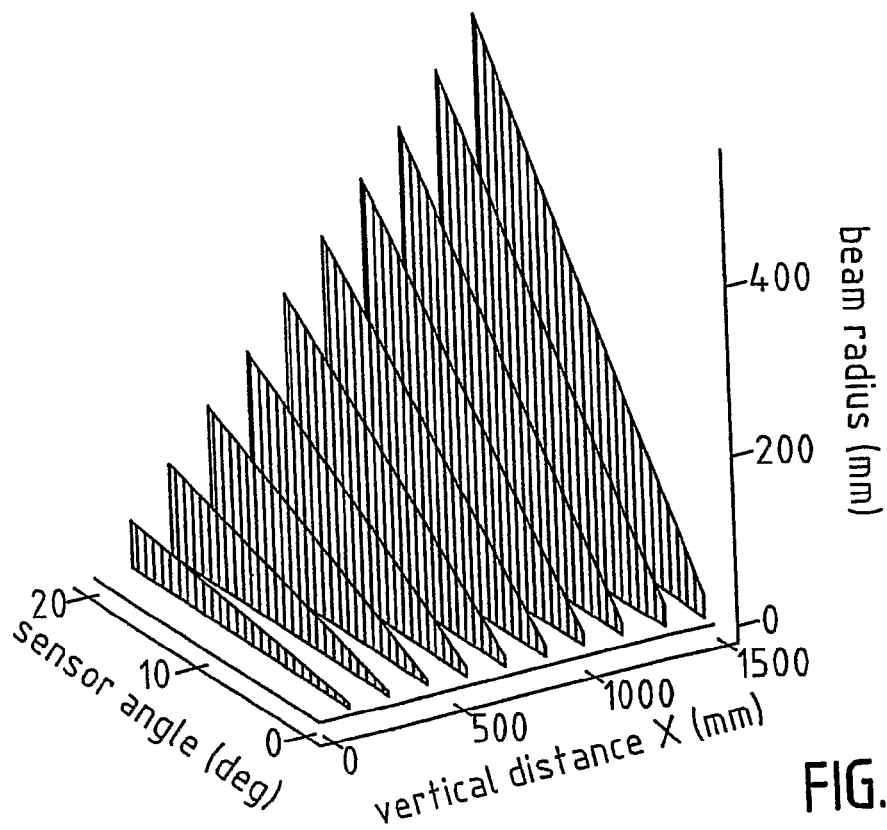
FIG. 6 is a three-dimensional graph showing beam radius against beam angle and vertical distance.

The ultrasonic beam cone angle is important to provide reliable hand control. In FIG. 4 the beam radius at the reference position is r. The beam radius rh at the hand position must be high enough to have optimum control by hand. During control of a lamp property the average beam radius should be equal to approximately half the length of the average hand shape as shown in FIG. 5. If the total control range is around X/2 (for a lamp/table application), the ultrasound beam angle at the minimum beam radius during control of the lamp property will be around Lh/2. For example: if Lh=150 mm and X=1.5 m, the ultrasound beam angle θ should be 11°. The relationship between the vertical distance X and the beam angle as function of the beam radius is shown in FIG. 6. Lamp control will be possible if the hand 2 is in the narrow ultrasound cone 4 as shown in FIG. 7. Reduction of a wide ultrasound beam 4 and an increase of sound pressure level (SPL) of an ultrasonic transducer 5 may be achieved by a horn 6 as shown in FIG. 8.

Figure 9:
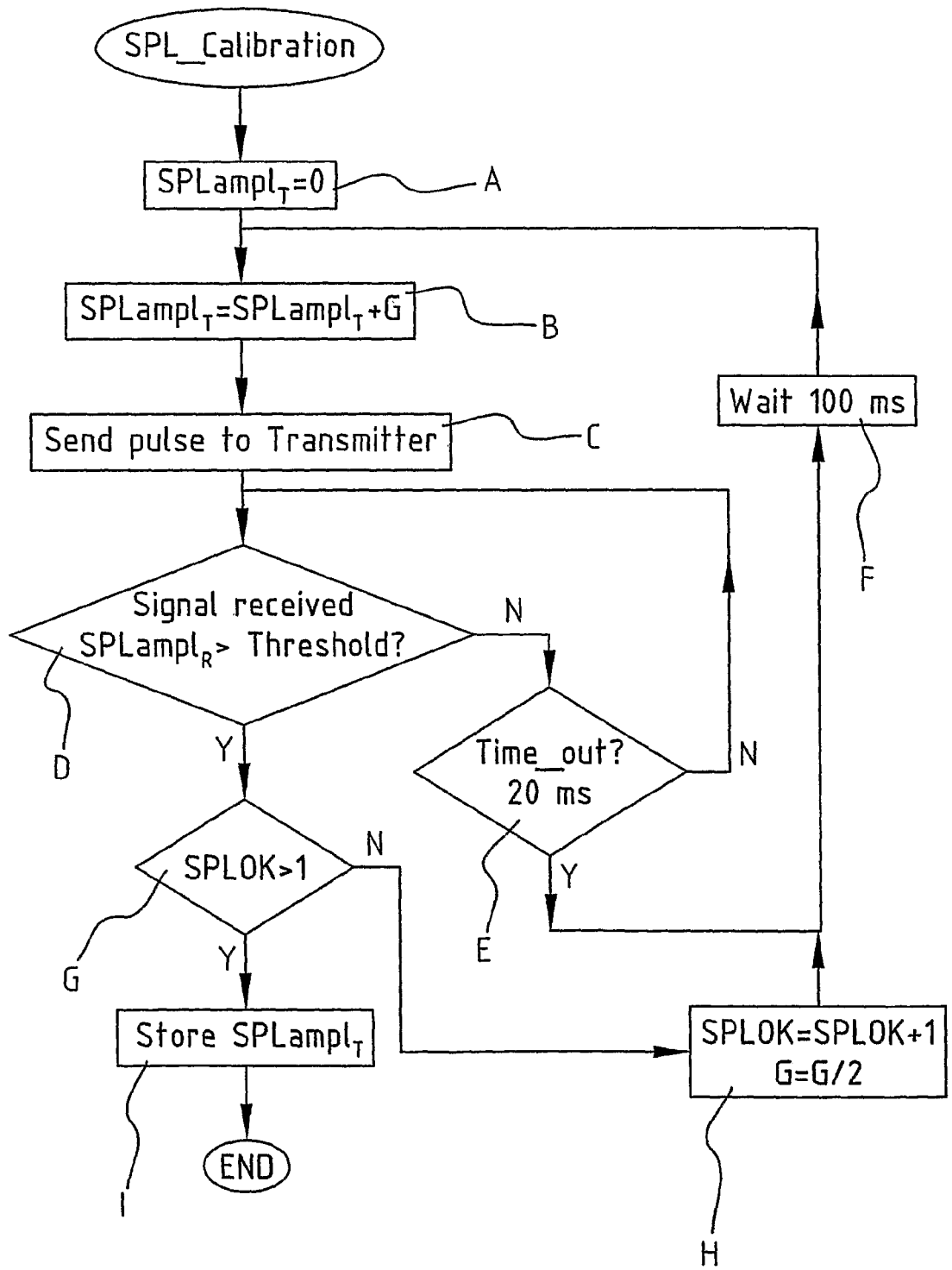
FIG. 9 is a flow chart showing the calibration process of the lamp system.

FIG. 9 shows the calibration process of the sound pressure level (SPL) generated by the ultrasound transducer. In step A, when the lamp is switched on, the value for the representative of the sound pressure level amplitude ($SPLampI_T$) as transmitted by the transducer is zero and the value of the sound pressure level status (SPL OK) is zero. Said representative for $SPLampI_T$ may for instance be expressed in a voltage which is put on the transducer.

In step B the first calibration cycle is started by the processing means, by increasing the transmitted sound pressure level amplitude value by incremental increase value (gain) G. In step B the transducer sends an ultrasound pulse based on said $SPLampI_T$ value. In steps D and E the processor monitors during a maximum period of 20 ms if a signal is received that is greater than a predetermined threshold value. If no such signal is received after 20 ms, in step F a period of 100 ms is waited, and the loop is repeated as from step B.

If in step D it is determined that a signal $SPLampI_R$ is received that is greater than a predetermined threshold value, at least two extra smaller increases of $SPLampI_T$ may be made in order to ensure that the emitted amplitude has enough margin to compensate for instance for temperature changes. To that end, if in step G it is determined that SPL OK is not greater than 1, then in step H SPL OK is increased by 1, the value for the incremental increase is reduced to half the previous value, and after waiting 100 ms in step F the loop is repeated as from step B.

After these steps the final value for $SPLampI_T$ is established and stored in memory in step I. This value is then used during the remaining period that the lamp is on, i.e. the voltage represented by said value is put on the transducer during the light control process of the lamp as described above.

The above calibration process of the SPL does not necessarily take place on a fixed reference surface such as a table. It can also be applied while the user is holding his hand in the ultrasonic beam, preferably at the lowest point of control operation. Thereby the SPL can be set at a lower level than for instance would be the case if the fixed reference surface would be a floor. It is even possible to combine the SPL calibration process with the control movement of the hand, and dynamically calibrate the sound pressure level while the hand is moving in the ultrasonic beam.

Figure 10:
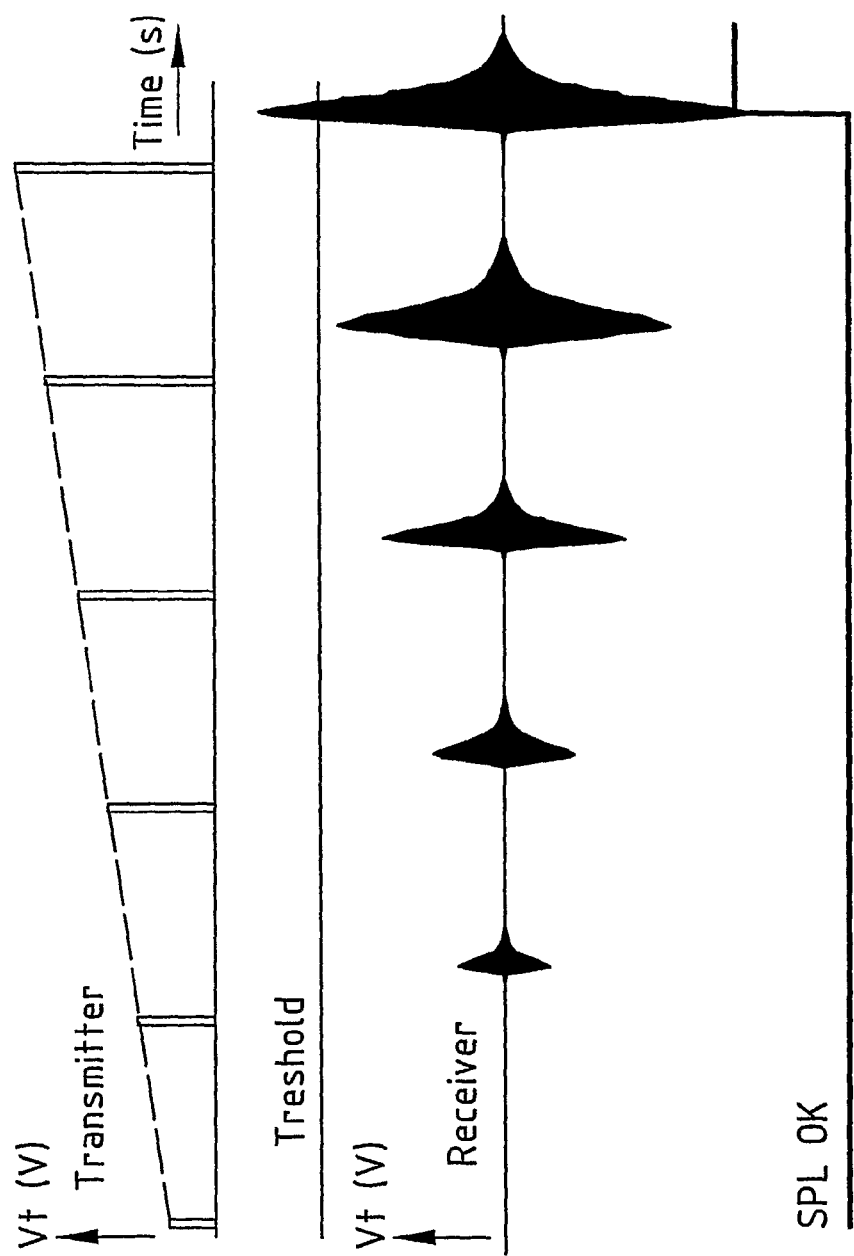
FIG. 10 is a combined drawing showing graphs of the voltage of the transmitted ultrasound pulse signals, the voltage of the received reflected signals and the status of the sound pressure level calibration in time.

The process of increasing the voltage put on the transducer during the transmission of ultrasonic pulses and measuring the voltage of the received reflected signals from the transducer, and increasing the SPL OK status until the threshold is exceeded is shown in FIG. 10.

Figure 11A:
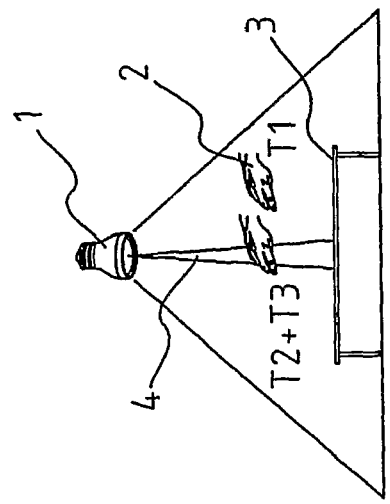
FIGS. 11A-11C shows schematically the movement of a hand in and out of the beam.
Figure 11B:
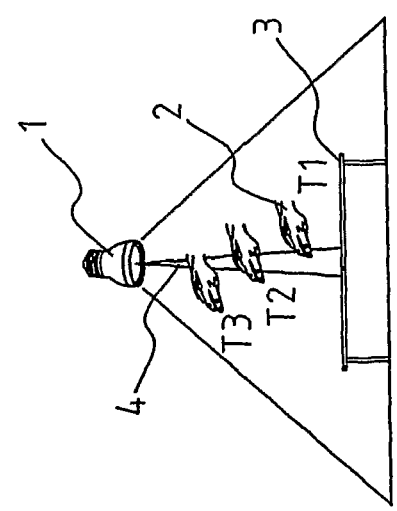
Figure 11C:
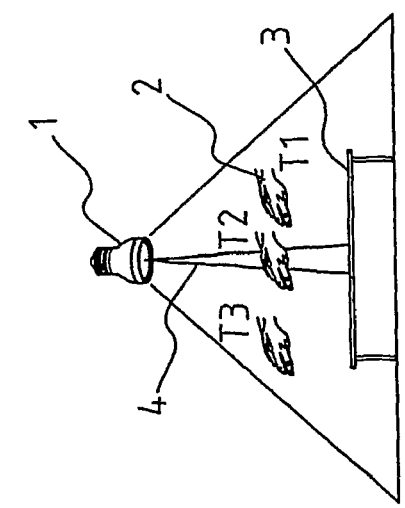
Figure 12:
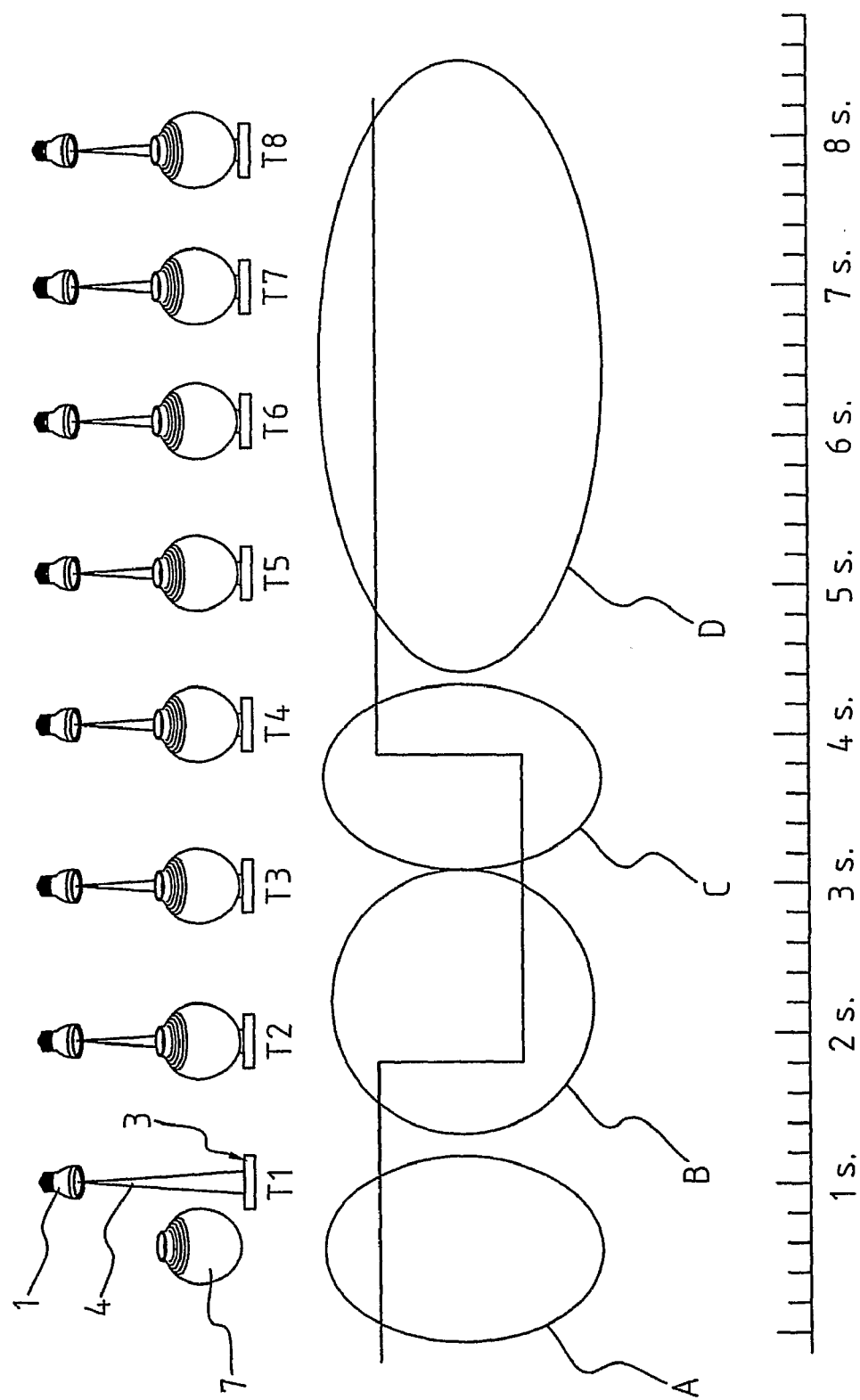
FIG. 12 shows schematically the movement of a vase in the beam and the related graph of the time-of-flight against time and the various phases of control.

There are two important issues with respect to robustness of gesture light control based on ultrasound: acoustic issues like reflections, diffraction, fatal interference, extra noise adds to receiver, and user interface issues like unstable objects (as shown in FIG. 11A-11C), changed (reference) objects (as shown in FIG. 12), and different objects at the same time, etcetera.

In FIG. 11A a hand 2 is shown, which accidentally moves horizontally through the ultrasonic beam 4 from T1 to T3. In FIG. 11B a hand 2 is shown, which accidentally moves vertically through the ultrasonic beam 4 from T1 to T3. In FIG. 11C a hand 2 is shown which moves into the ultrasonic beam 4 from T1 to T2 and is held stably in said beam until T3. It is desirable that the accidental movements as shown in FIGS. 11A and 11B do not incur any light control actions. The action as shown in FIG. 11C however is proposed to be a user command that enables light control thereafter, as explained above with reference to FIG. 3.

In FIG. 12 a vase 7 is shown, which is put on the reference surface 3 (for instance a table) between T1 and T2. Thereby the measured time-of-flight is shortened. On T1 lamp control is disabled (stage A), and the shortened time-of-flight will result in enablement of the lamp control (stage B), as explained above with reference to FIG. 3.

If however the vase 7, is in the beam 4 for more than a predetermined period, for instance 1.5 seconds or longer, then it is assumed that a new reference object is placed in the beam (stage C). The measured value is then stored as the new reference value and control is disabled (stage D).

Figure 13:
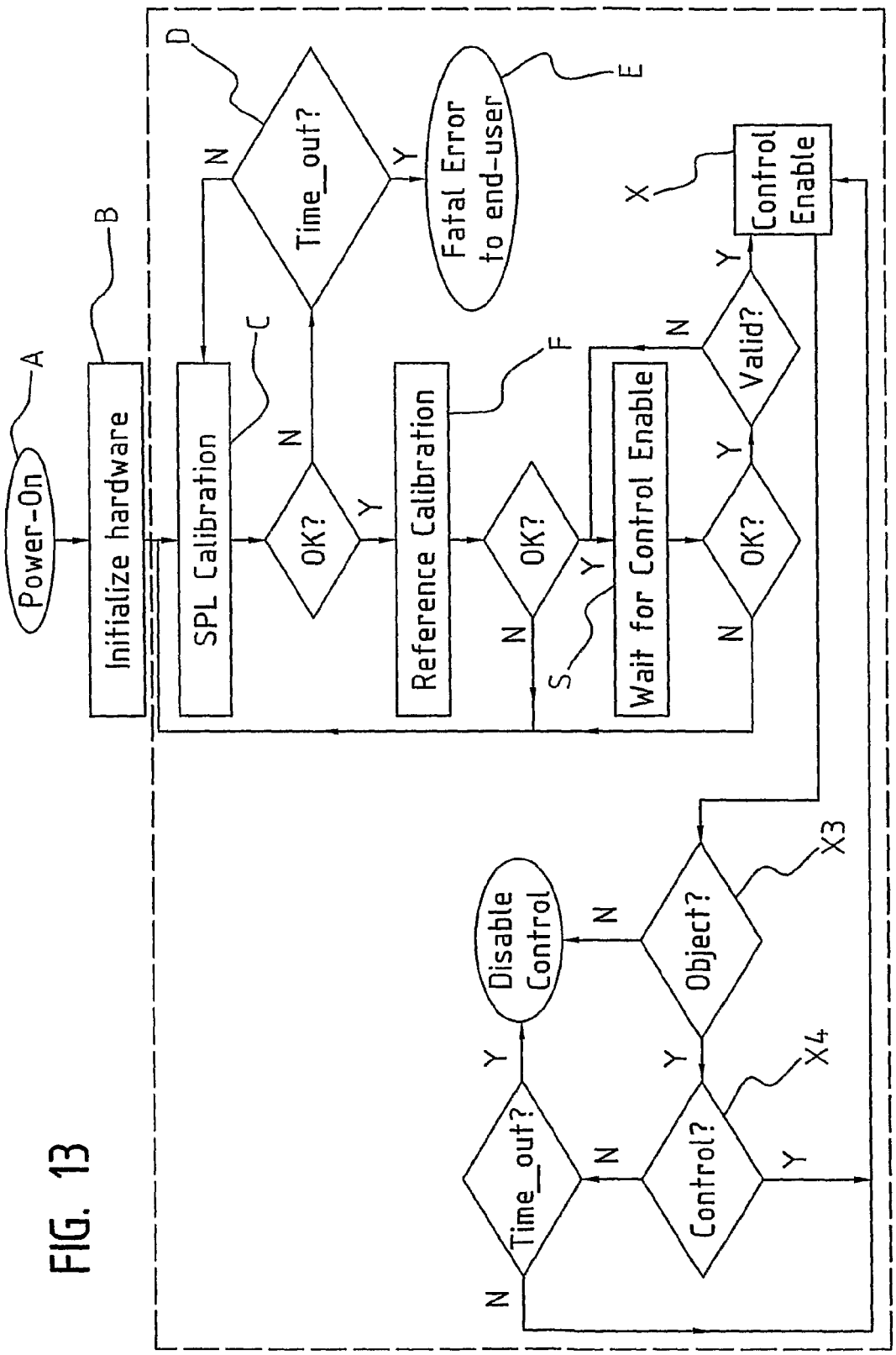
FIGS. 13-18 and 20-21 show flow charts of various control algorithms.

In FIG. 13 a basic algorithm for gesture light control is shown. If we the lamp is switched on (step A) and hardware is initialised (step B) the sound pressure level will be calibrated (step C) as described above with reference to FIG. 9. The ultrasonic transceiver will be sent an acoustic signal to check if a (reference) object is present and to regulate the sound pressure of the acoustic echo signal to a minimum. If no signal is received after a predetermined period (step D), an error signal is generated and presented to the user (step E).

Then a reference calibration (step F) will be performed at a fixed obstacle like a table, a floor, etcetera and is based on the first received echo signal after sending a pulse to the transmitter. Other received echo signals shifted in time (compared with the first received echo) are signals based on reflection (as shown in FIG. 1). These signals are eliminated.

Figure 14:
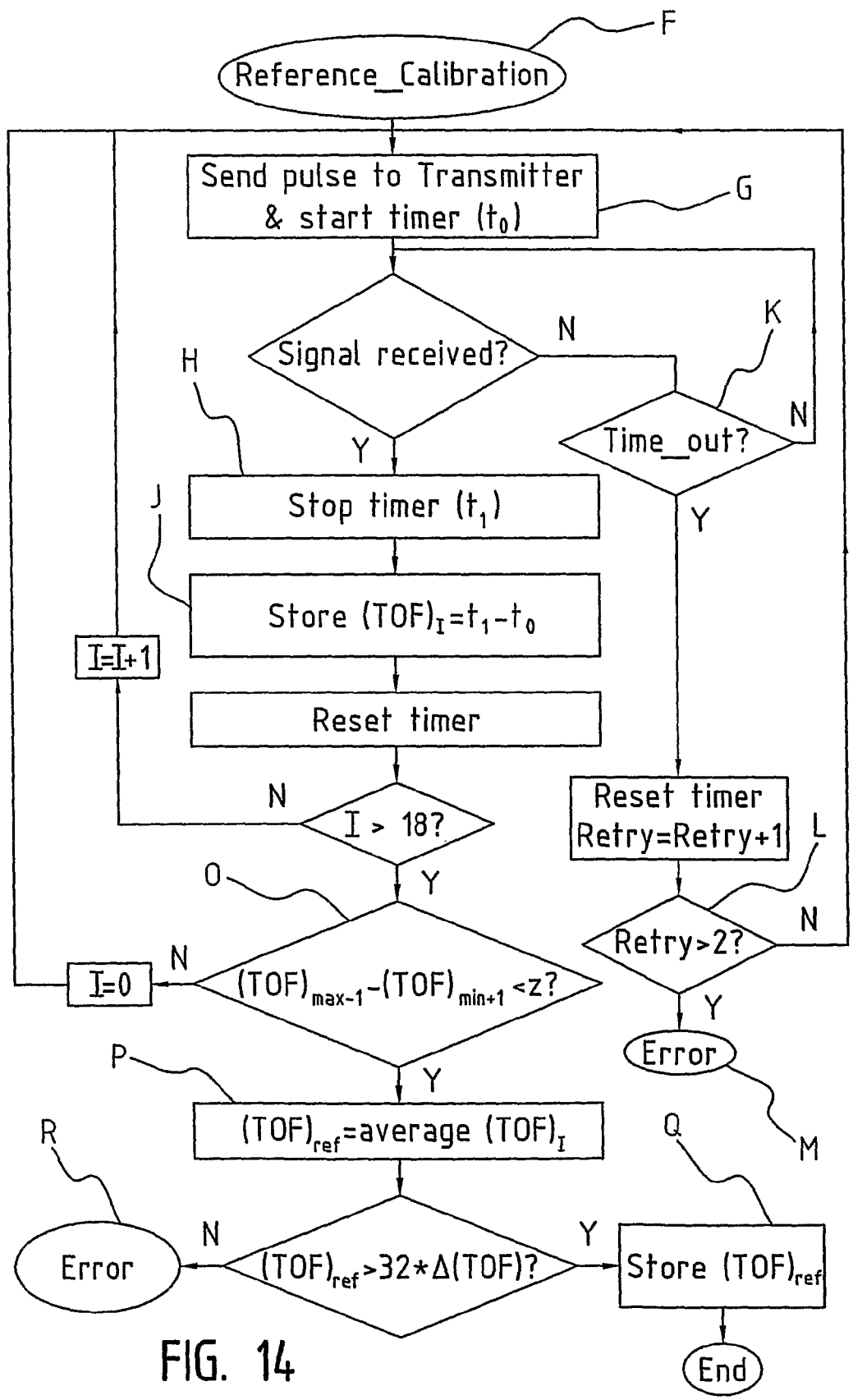

The reference calibration algorithm (step F) is further explained with reference to FIG. 14. A pulse is sent (step G) and the time-of-flight from the source to the reference surface and back to the source is measured (step H) and stored as $TOF_I$ (step J). If no signal is received after a predetermined time-out period (for instance 3 seconds) (step K) after more than two attempts (step L), an error signal is generated and presented to the user (step M). Reproducibility of this measurement is checked by repeating the measurement for I=0 to I=19. A check is performed if the stored values for $TOF_I$ (apart from the two most extreme values) are within a predetermined threshold z (step O), otherwise the reference calibration is started again. Then the average reference value $TOF_{REF}$ is calculated (step P) and is stored as representative of the maximum allowable distance (step Q), but only if said $TOF_{REF}$ is larger then a predetermined minimum, otherwise an error signal is generated and presented to the user (step R). In this example said minimum is 32 times a predetermined minimum increment, so that at least 32 incremental distances of a hand movement can be measured and translated into control instructions. During gesture control no movement beyond the maximum distance represented by $TOF_{REF}$ is expected nor tolerated. The reference distance will also determine the control range.

Figure 15:
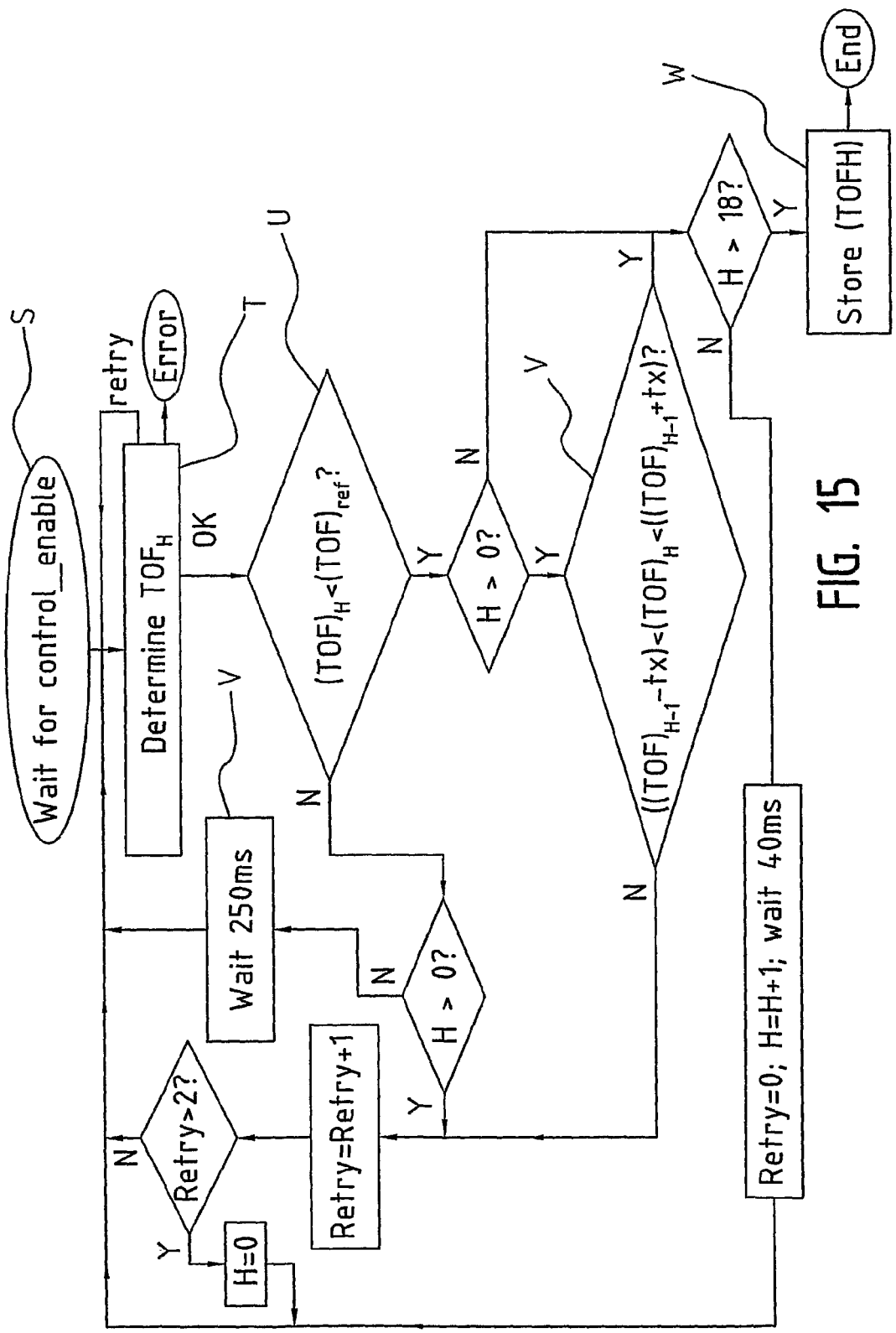
Figure 16:
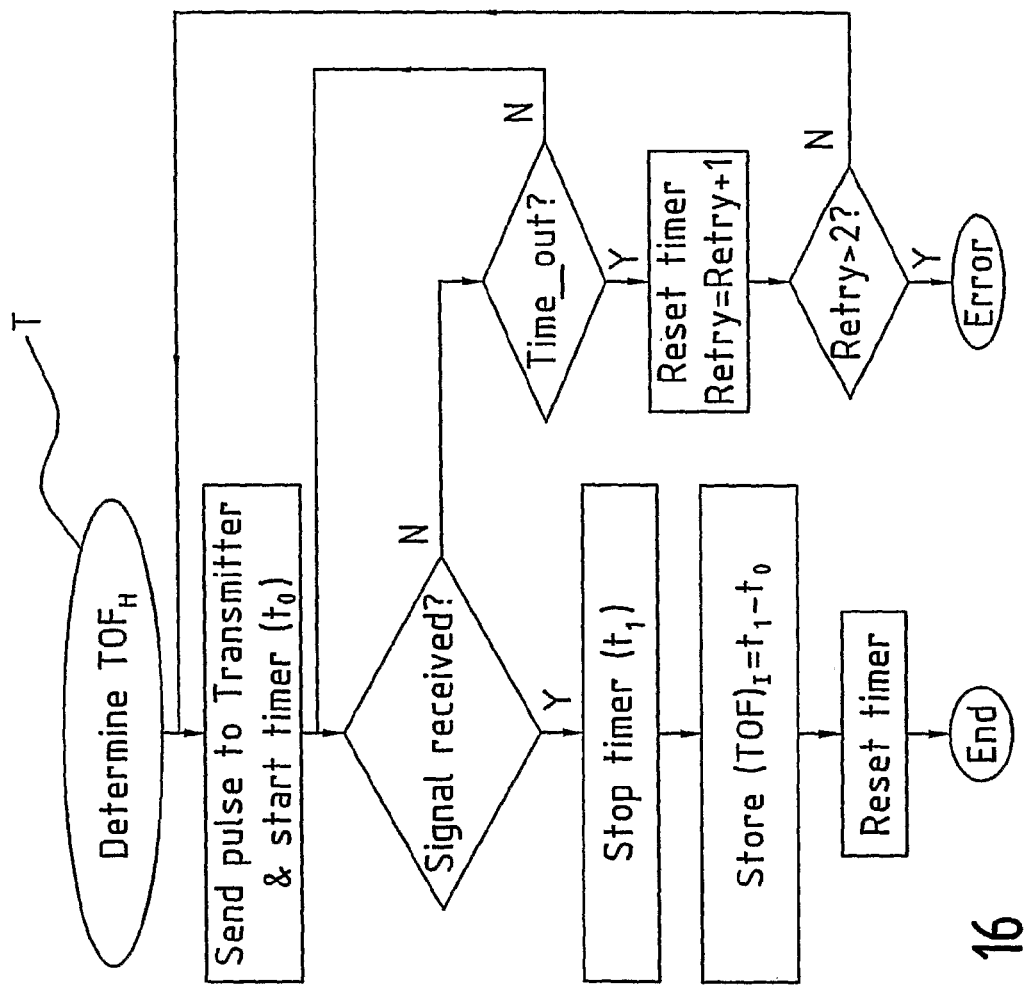

After the reference calibration (step F) the system is set into a "wait-for-control-enable" state (step S), as shown in FIG. 15. The sample frequency is reduced to 4 Hz (250 ms) (step V). The system will wait for an obstacle/object (e.g. a hand), by measuring $TOF_H$ (step T, shown in more detail in FIG. 16; Time_out=100 ms) and comparing said $TOF_H$ with the reference value (step U). As long as $TOF_H$ is greater than or equal to the reference value $TOF_{REF}$ it is assumed that no object is present in the beam and the system will repeat this cycle at the sample frequency.

If $TOF_H$ is smaller than the reference value $TOF_{REF}$ twenty measurements (for H=0 to 19) during 1 second are performed to check if the object is stable, by checking if the difference between $TOF_H$ and the previous measurement $TOF_{H-1}$ is smaller than a predetermined threshold tx (for instance a value representing a distance of 2 cm) (step V). If this is the case the average of the measured TOF-s, TOFH (step W) is stored and the algorithm continues to the control enable step (step X) in FIG. 13. During the control enable cycle the system checks if the object (hand) is still present in the beam (step X3 in FIGS. 13 and 17) and if the object is making control gestures, i.e. by moving (step X4 in FIGS. 13 and 17), as explained in more detail with reference to FIG. 17 below. Through the above-described algorithm the system will not react on short (<1 second) disturbances of the ultrasound beam cone during the wait-for-control-enable cycle. A continuous check if echo signals are received will be carried out at the reduced sample frequency.

By the proposed algorithms the control of light will be only possible when the hand movement fulfils a certain profile, as exemplified above with reference to FIG. 3. Control is disabled when the hand is moved outside the ultrasound beam cone (step D in FIG. 3). Control is also disabled when the reference object is changed, as explained above with reference to FIG. 12.

Figure 17:
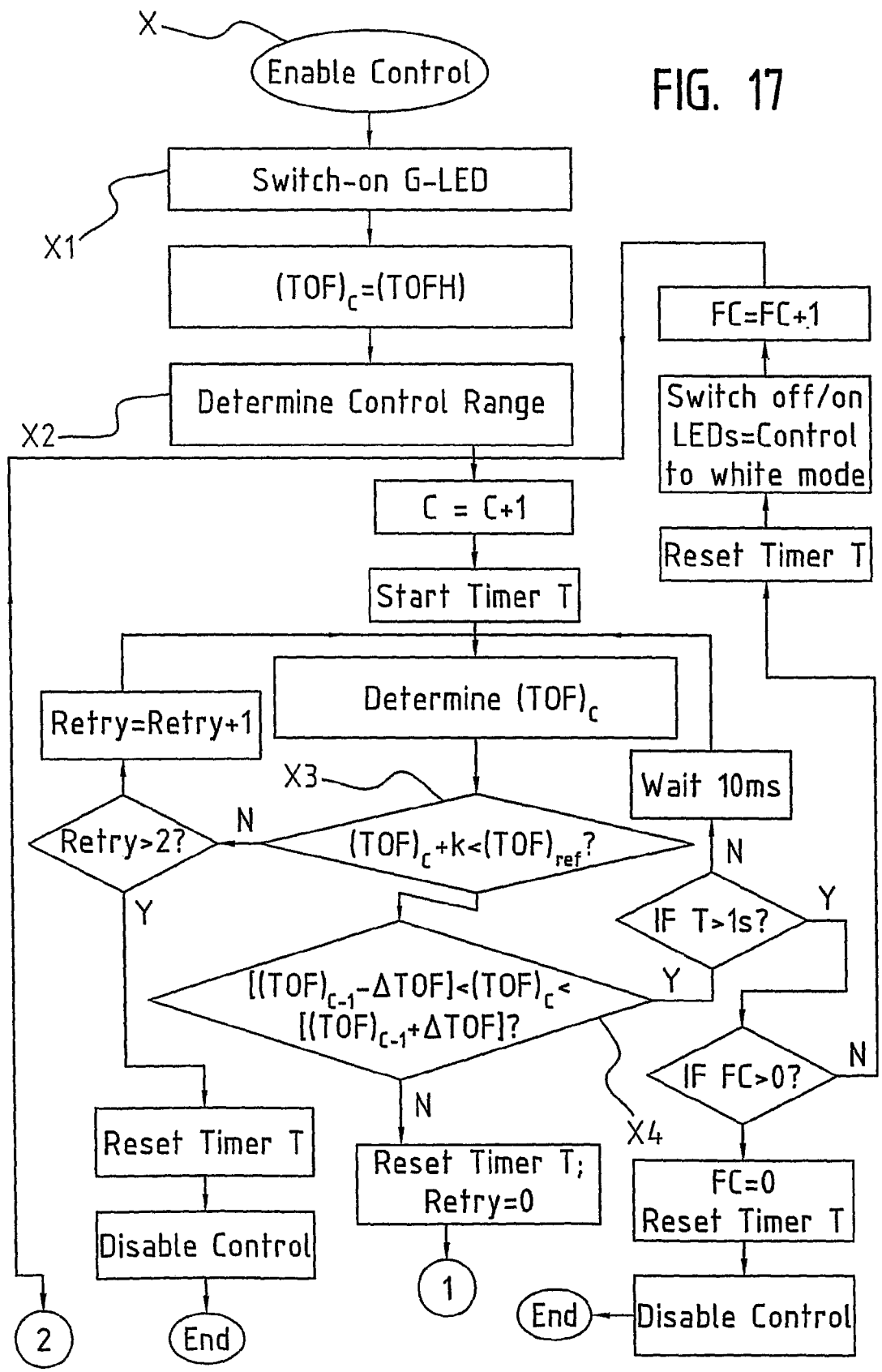
Figure 18:
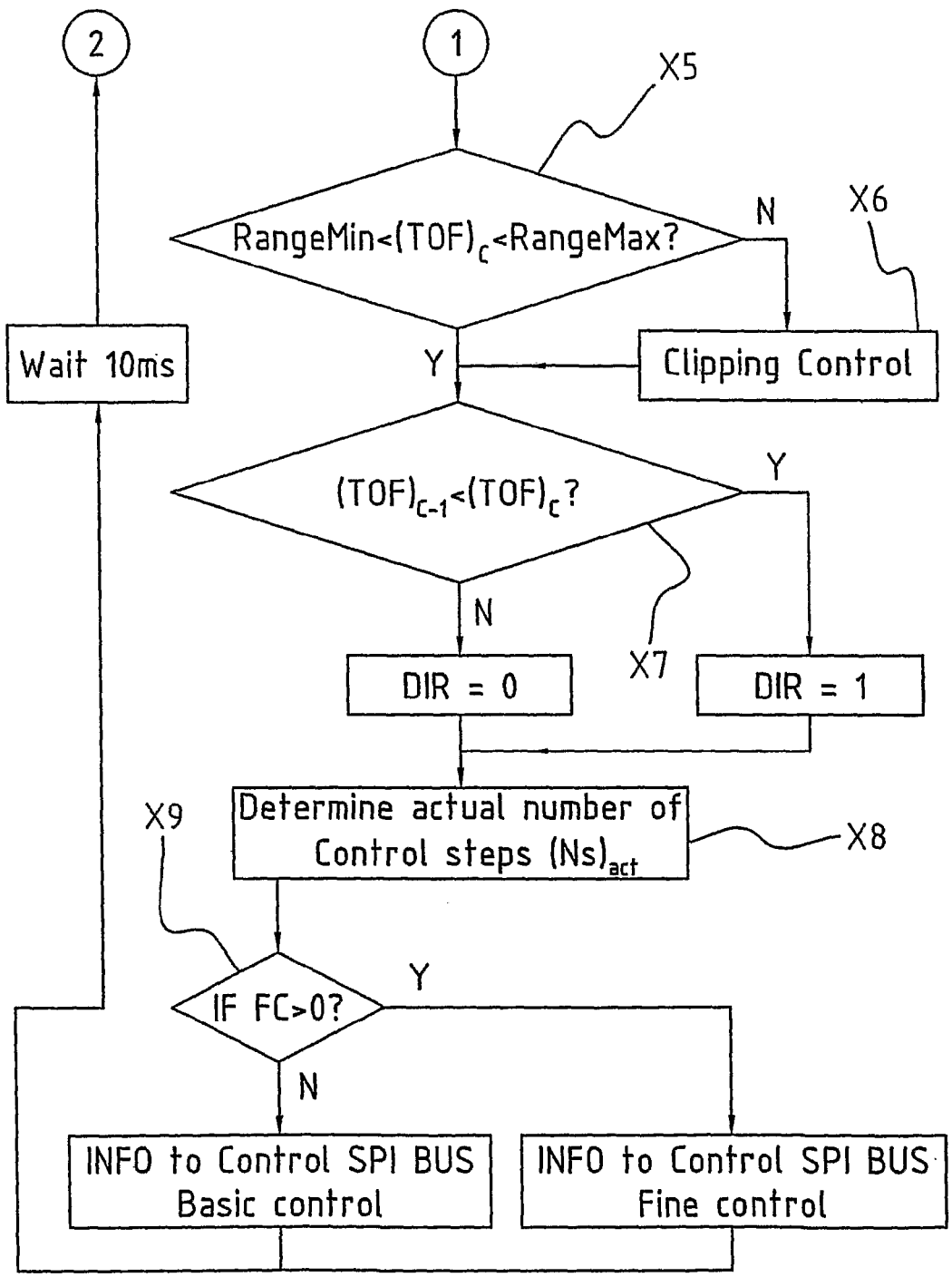

Now with reference to FIGS. 17 and 18 (wherein C and FC start with value 0) the enable-control algorithm (step X) is further explained. In order to give feedback to the user with respect to the fact that control is enabled, a visual signal is given, for example in this embodiment a green LED (G-LED) will be switched on (step X1). The sample frequency is increased to 40 Hz.

Figure 19:
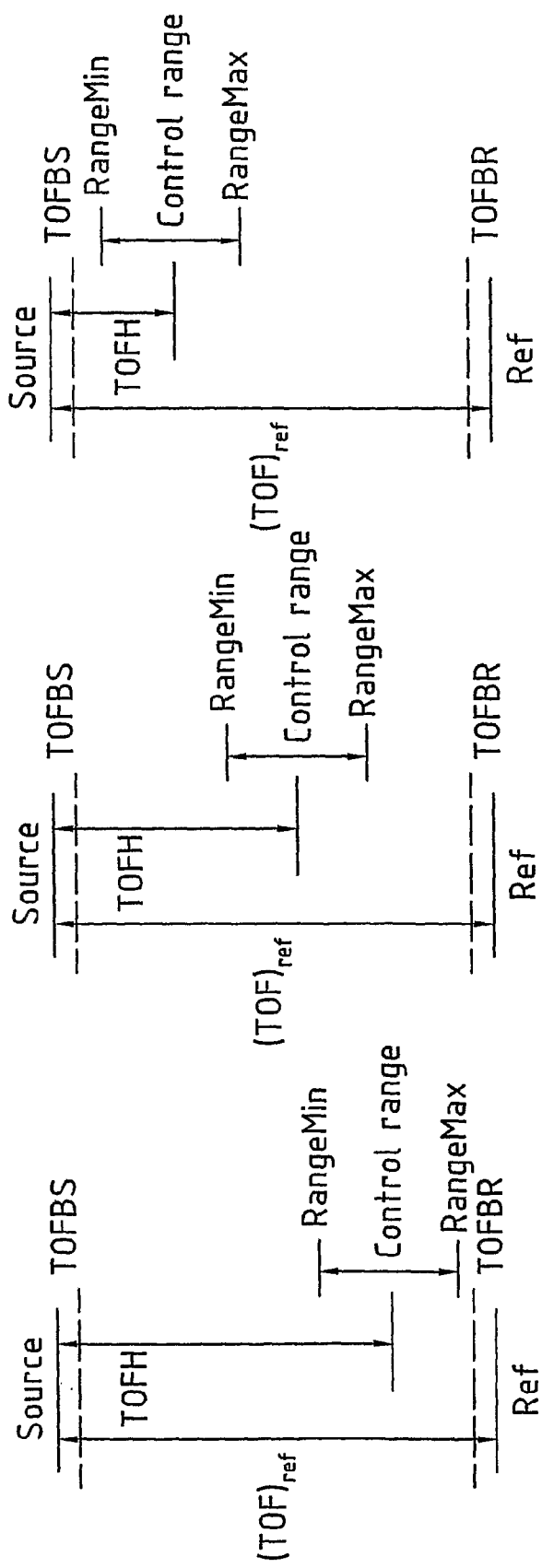
FIG. 19 schematically shows the determination of the control range.
Figure 20:
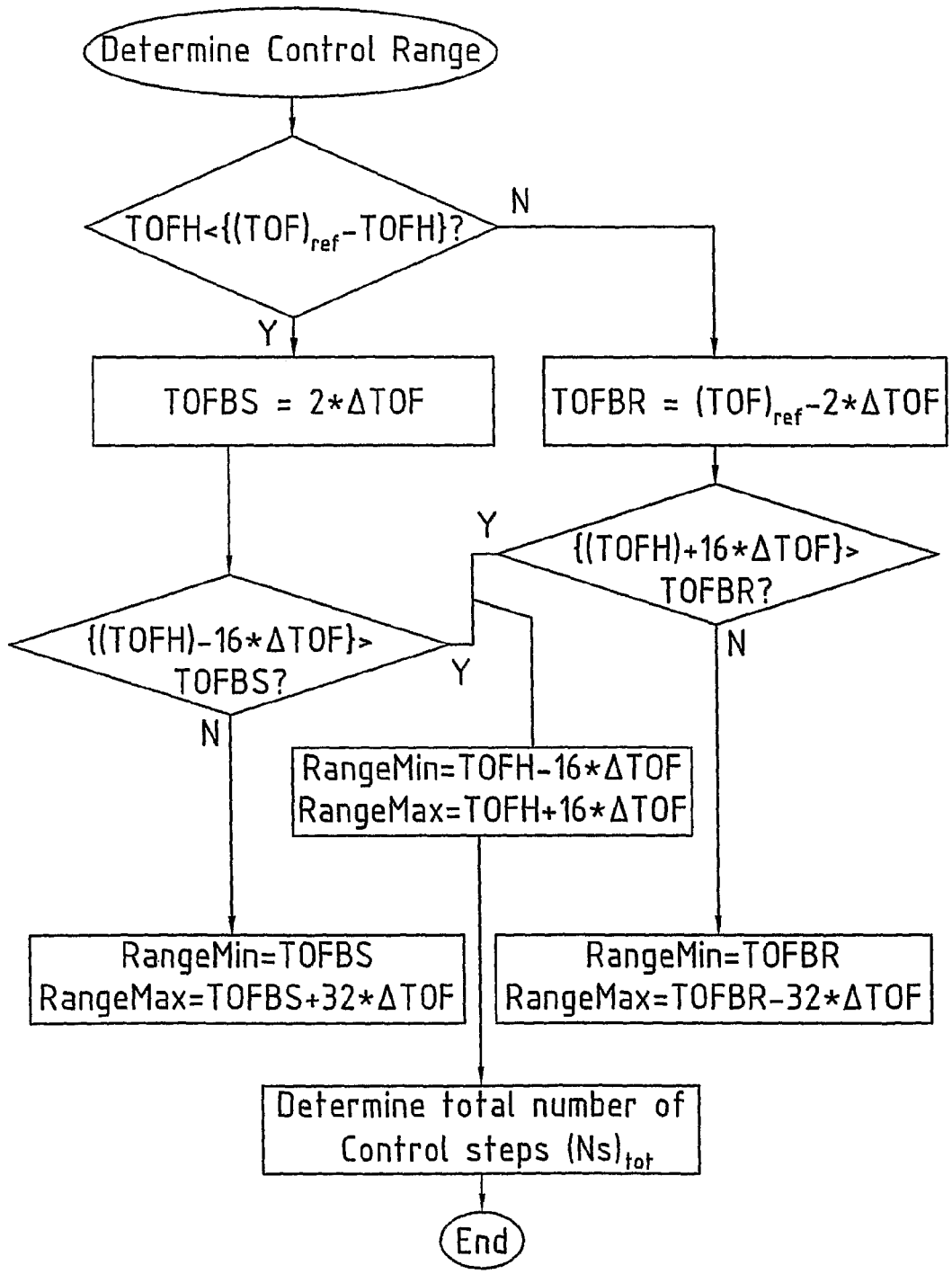

Based on the determined TOF the control range will be automatically determined (step X2), as illustrated in FIGS. 19 and 20. Preferably the total number of steps $Ns_{tot}$ is chosen such that the sensitivity of the system, i.e. the length of a control step, is approximately 2 cm, which corresponds to a TOF of 0.116 ms (2*0.02 m /345 m/s). A preferred number of control steps of 32 is proposed, so that the control range of the hand is 64 cm, wherein the initial position of the hand is the centre of said range. However if the hand is closer to the source or the reference surface than 32 cm (minus a safety margin, reflected by TOFBS and TOFBR) obviously the control range cannot be 32 cm on either side of the hand, and the control range is shifted, for instance by locating the upper or lower limit of the control range (RangeMin or RangeMax) on the respective safety margin borders (TOFBR or TOFBS).

The time-of-flight ($TOF_C$) between the source and the hand is determined. Continuous checks are made to determine if the hand is still in the beam (step X3) and if the hand is moving (step X4). If the hand is not in the ultrasound beam anymore for a predetermined time, control will be disabled. If the hand is in the beam, but not moving for at least one second, it is checked if prior thereto light properties have been controlled (FC>0). If this is the case, the FC is reset to 0 and control is disabled. If this is not the case, the control mode is switched to controlling a different light property, indicated by FC being raised by 1, and the algorithm returns to $TOF_C$ determination loop.

Figure 21:
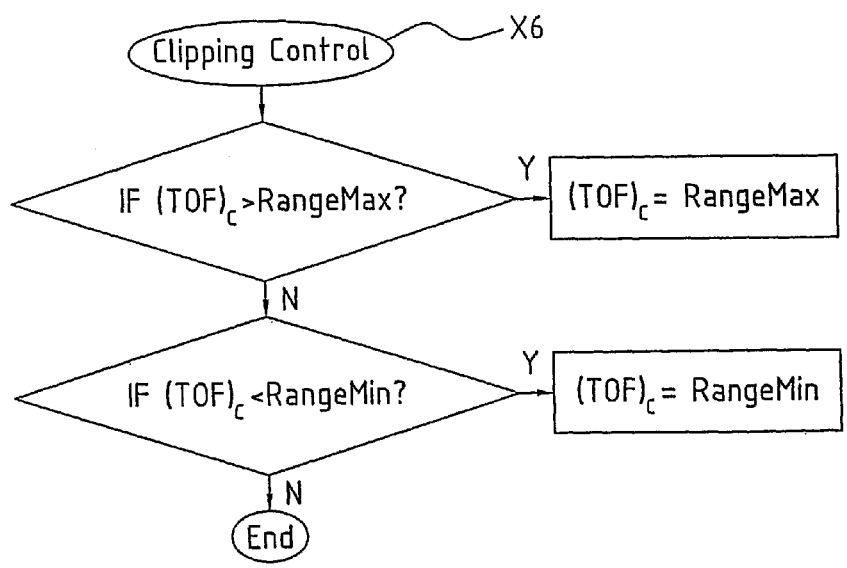

If it is determined that the hand is moving (step X4), and then it is checked if the $TOF_C$ is within the calculated range (step X5). If $TOF_C$ is outside said range clipping takes place (step X6), for instance by replacing $TOF_C$ with the nearest maximum value, as illustrated in FIG. 21. The direction (step X7) and the number of steps $Ns_{act}$ (step X8) is calculated, which is used to translate the physical hand position into a digital position value for control purposes.

$Ns_{act}$ is calculated by dividing the difference in the measured TOF ($TOF_C-TOF_{C-1}$) by TOF. These values are translated to a drive signal sent to the LED drivers to control the light properties. The current value of FC determines which one of the light properties is controlled (step X9). In this example there are only two properties to be controlled: "basic control" and "fine control", but this can be easily extended. This control loop for controlling a light property is repeated until control is switched off, or until FC is raised so that a different light property is controlled.

Three different methods are proposed as examples for selecting the light properties to be controlled, based on a menu structure. In the first method the selection of the basic light controls will be based on the freezing of the object (i.e. hand 2) during for instance 1 second. The second method of selection of the basic controls is based on rotation of the hand. The third method of selection in menu control for basic light controls is based on the hand crossing the ultrasound beam in horizontal direction (assuming that the ultrasound beam extends in vertical direction).

Figure 22:
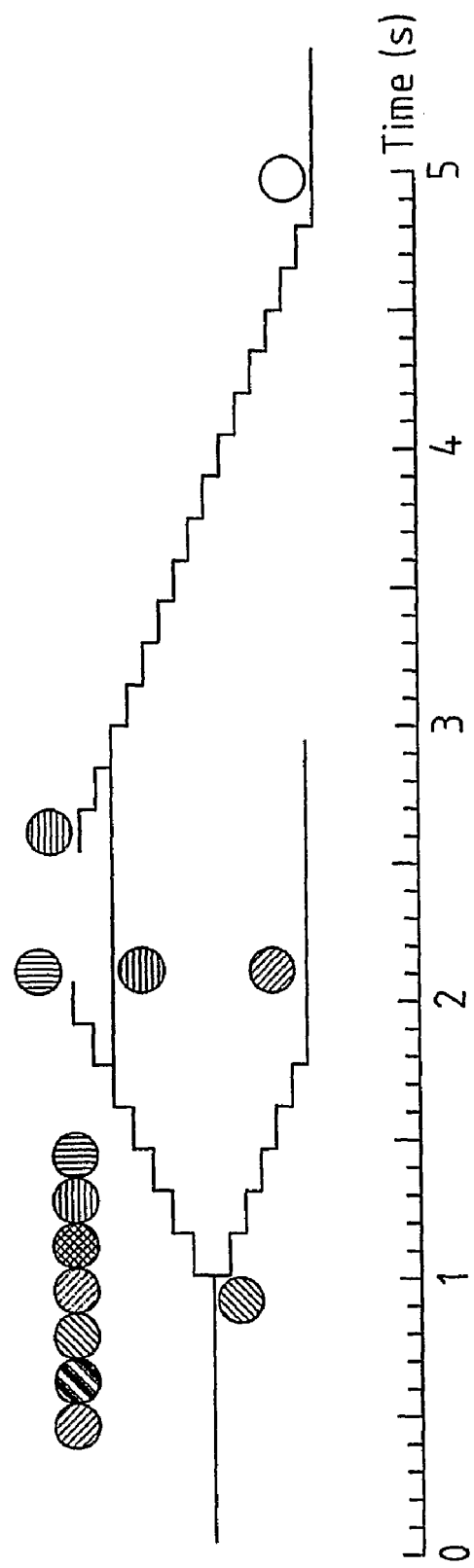
FIG. 22 schematically shows the control mechanism of different light properties in time.

With these methods the basic light controls can be selected in a sequential manner, as illustrated in FIG. 22. This means that if a user first selects a light colour (from 1 s to 1.8 s), the control selection is moved on towards control of the colour temperature of the chosen colour 1 second later (at 2.8 s). Control of colour temperature is then also achieved by hand movement (from 2.8 s). The control range is chosen the same as used for the previous basic control.

Figure 23:
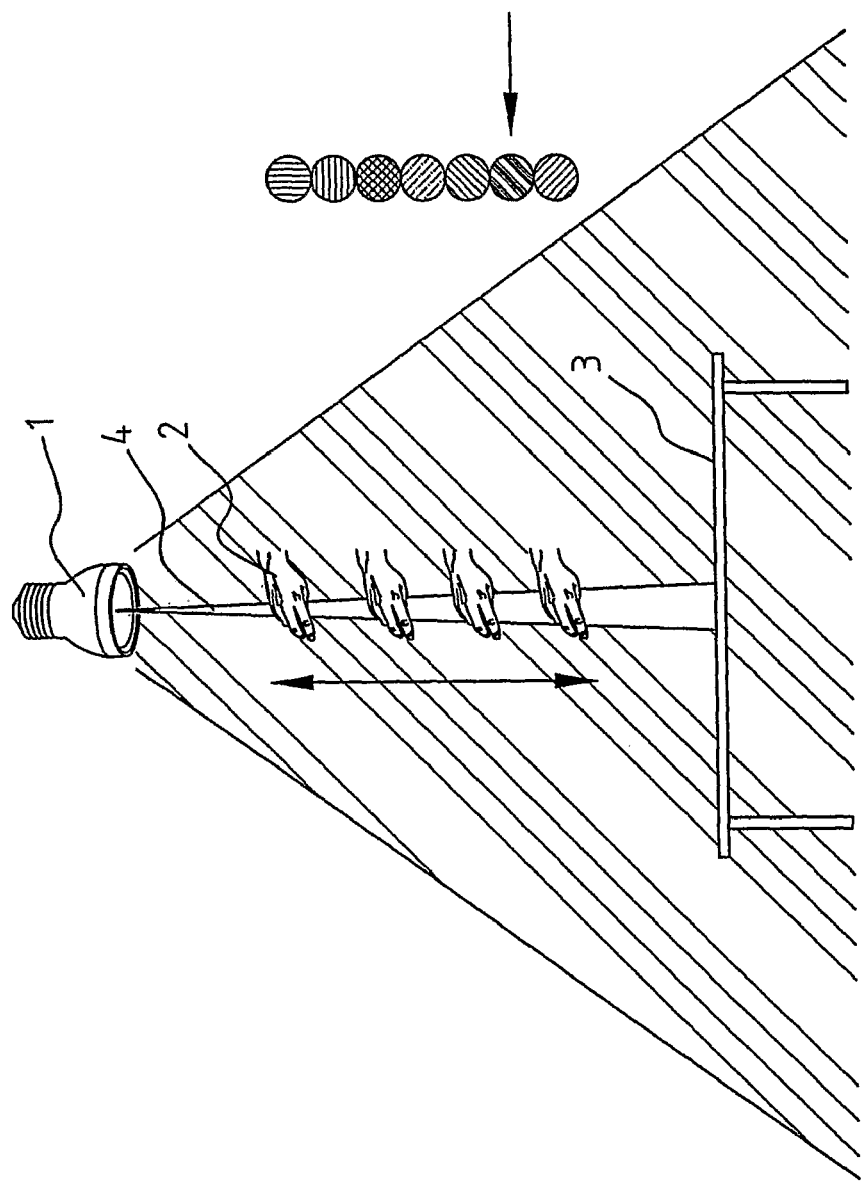
FIGS. 23-28 schematically show the control mechanism of different light properties in various stages.
Figure 24:
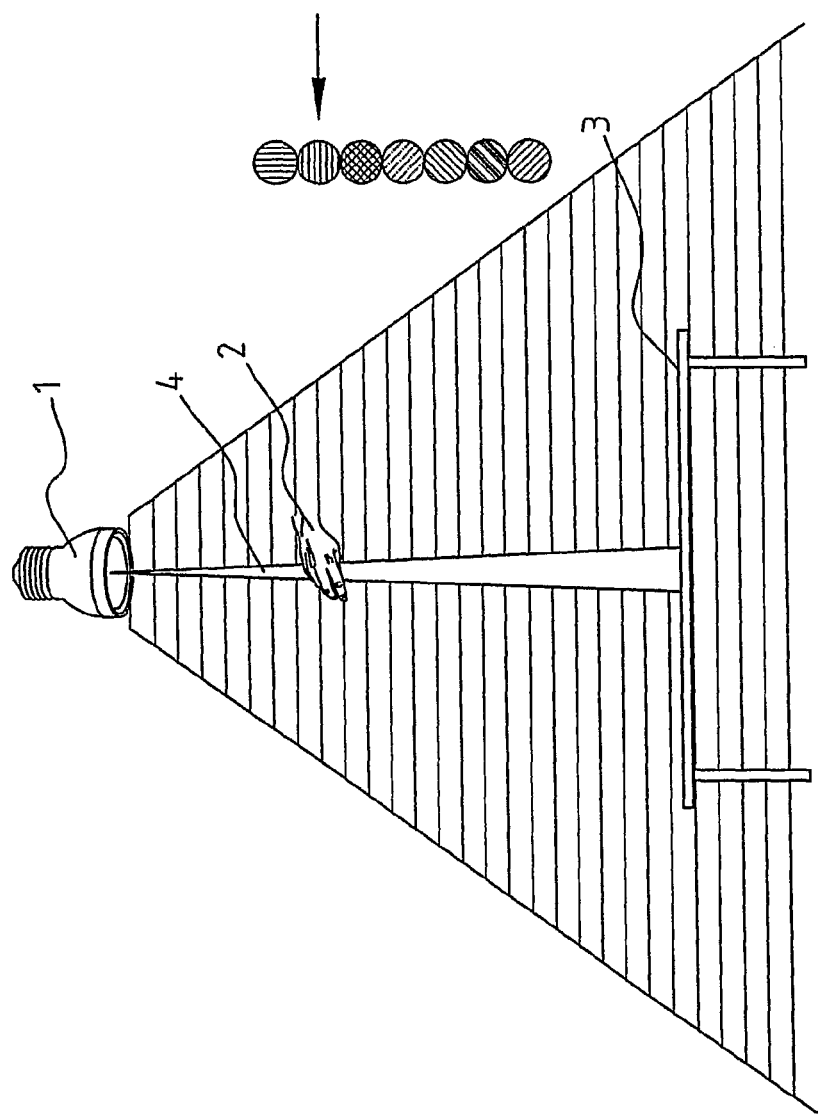
Figure 25:
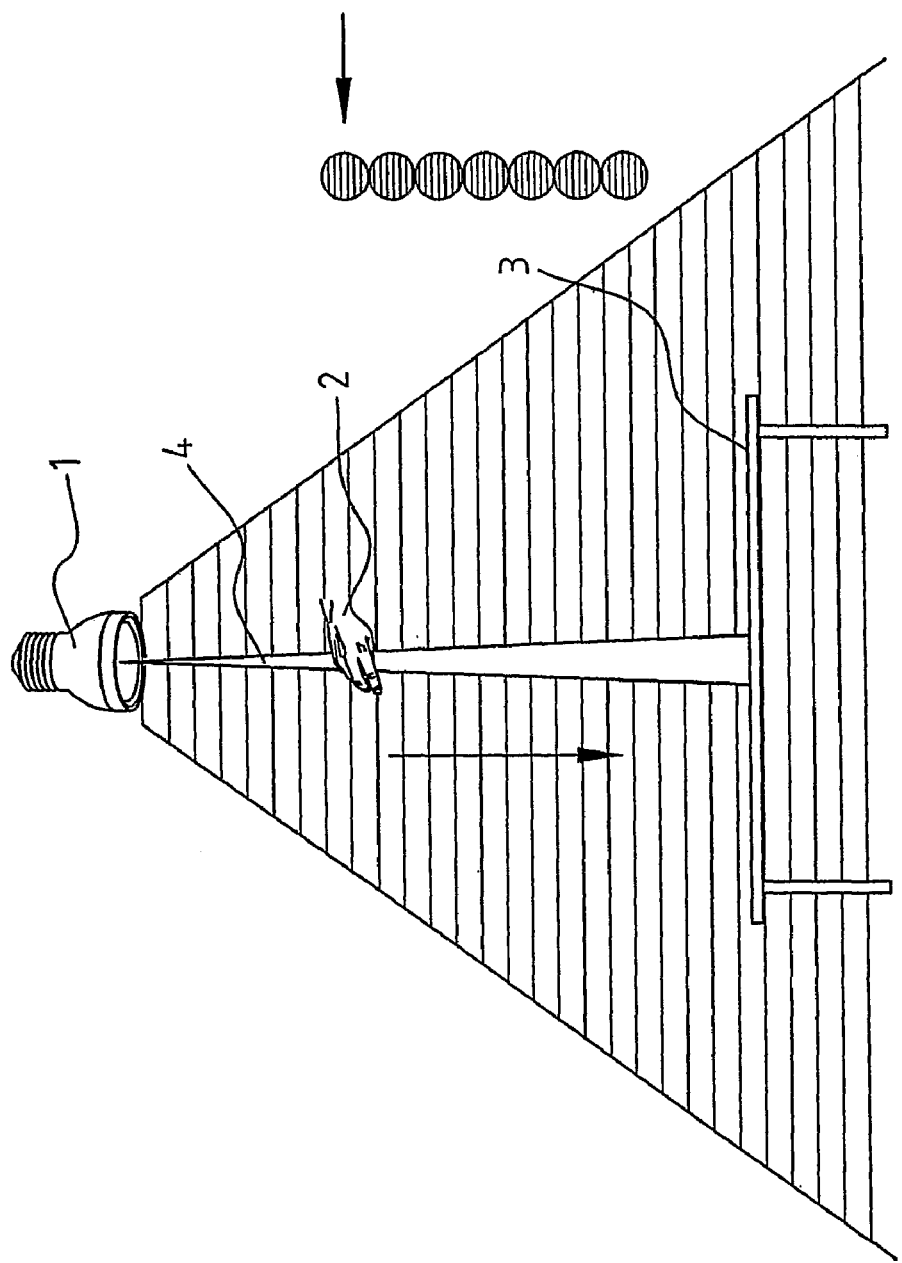
Figure 26:
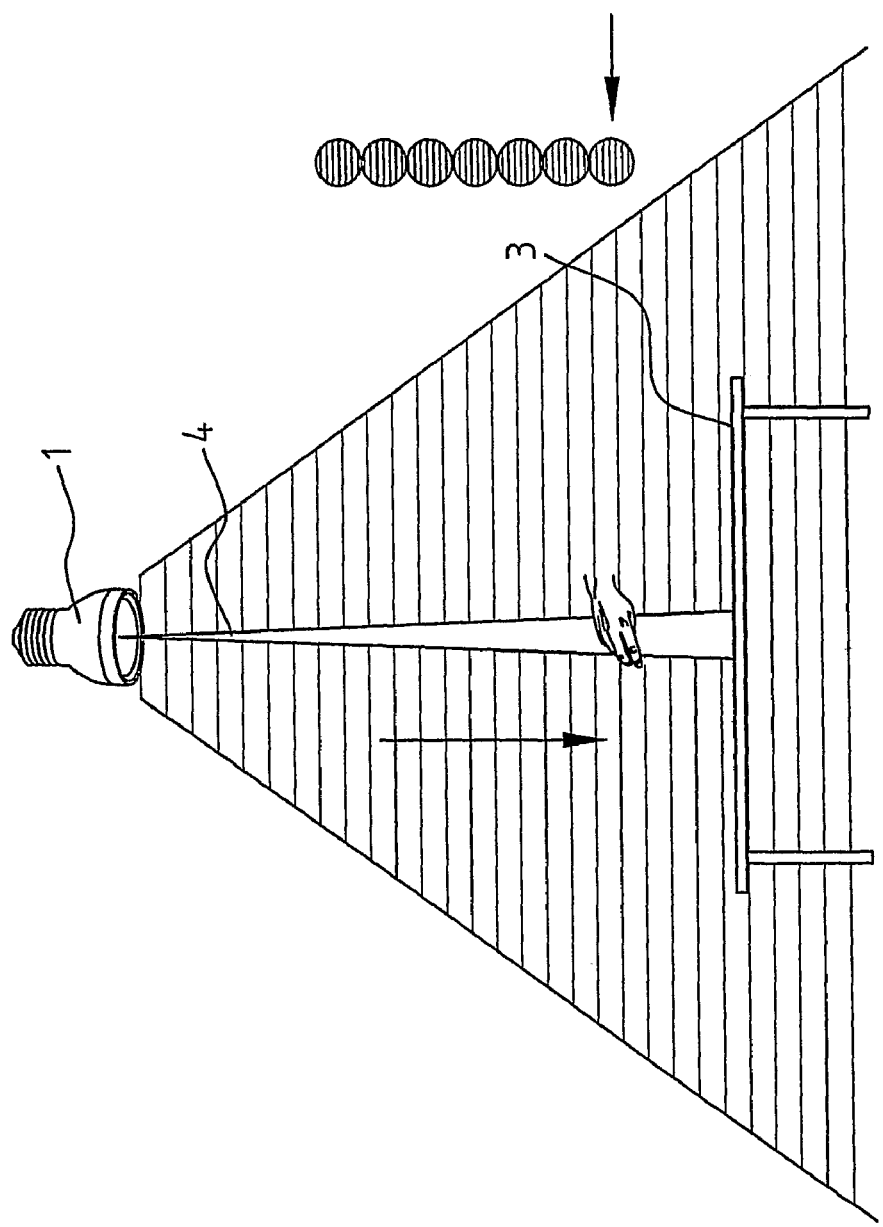
Figure 27:
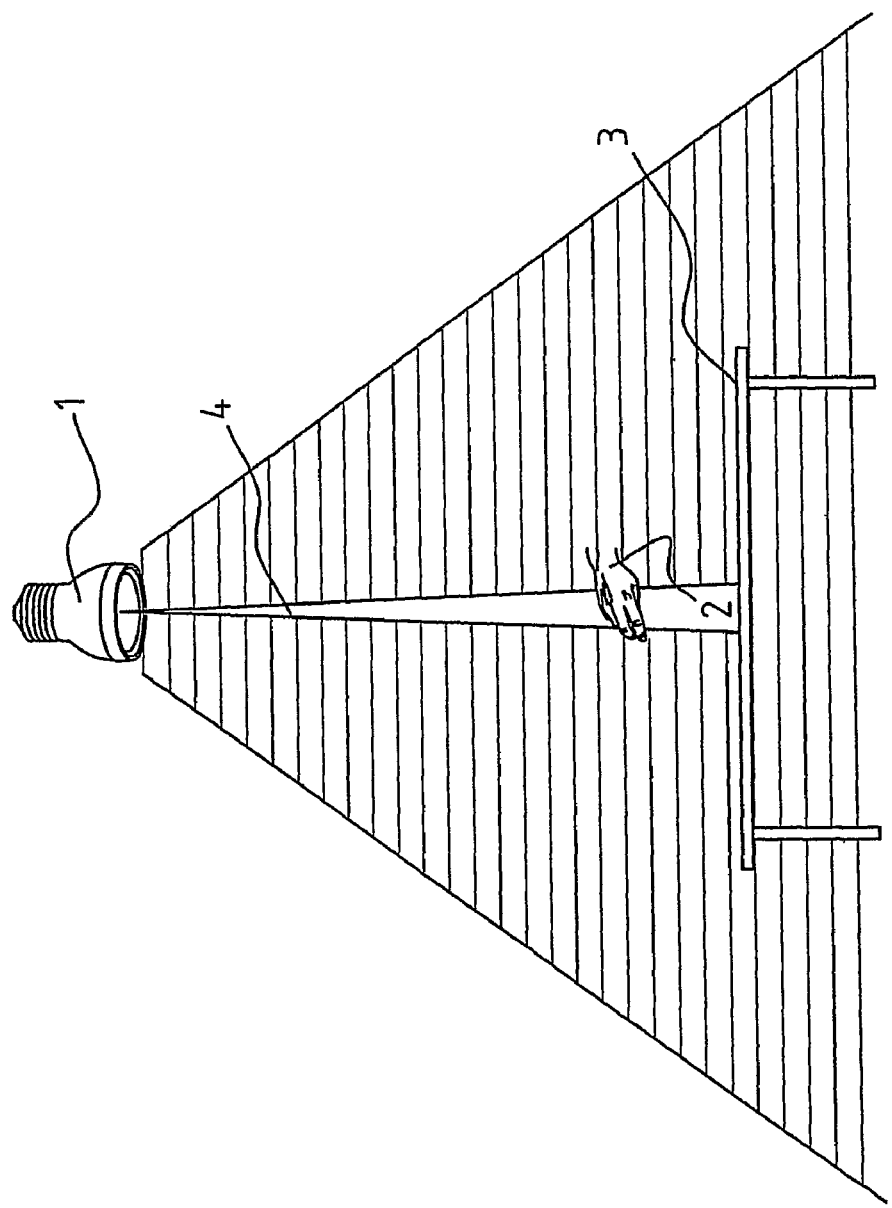
Figure 28:
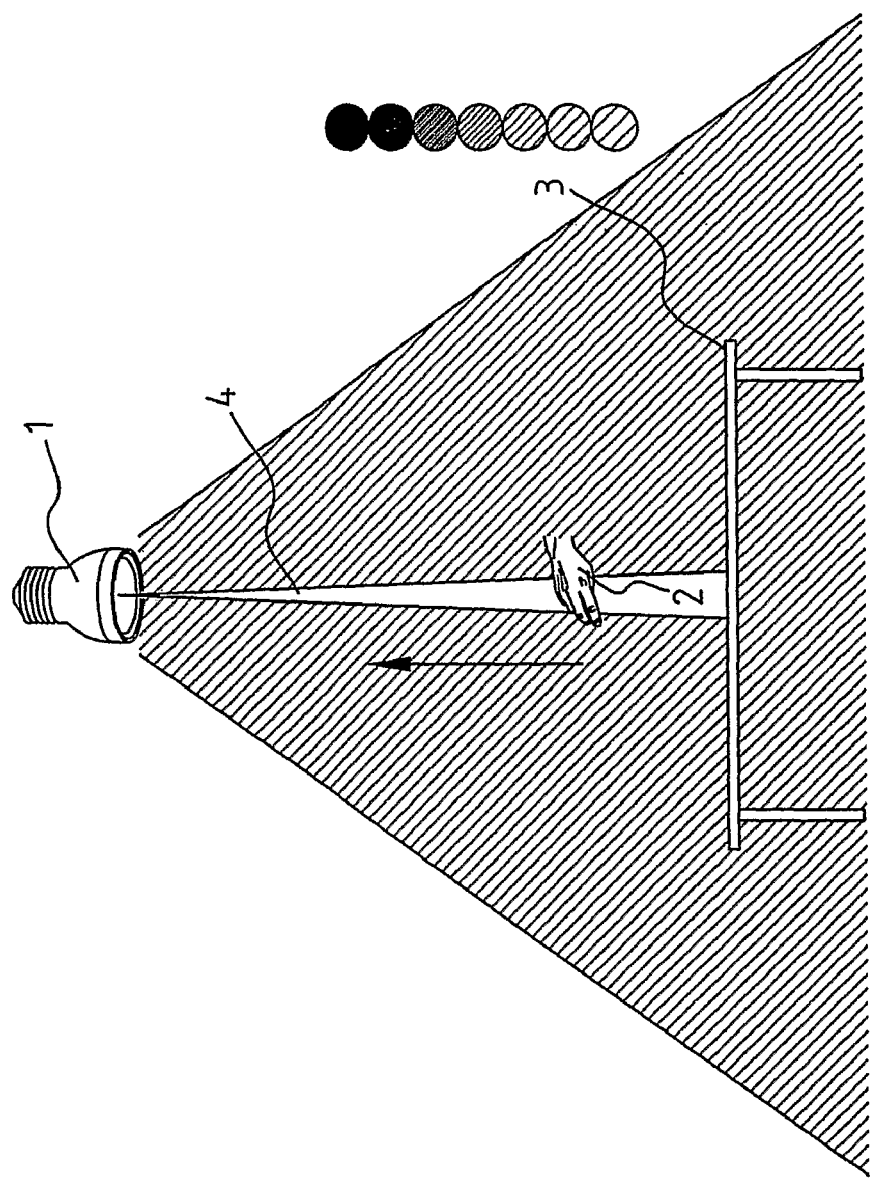

FIGS. 23-28 shows as an example the different steps in a menu for three basic LED light controls. In FIG. 23 the colour is controlled by up-and-down movement of hand 2. In FIG. 24 the hand 2 is frozen at specific desired colour for 1 second, so that said specific colour is chosen, and control selection is switched to colour temperature control in FIG. 25. In FIG. 26 the hand 2 is frozen at a specific desired colour temperature again for 1 second, so that said specific colour temperature is chosen, and control selection is switched to intensity in FIG. 27. In FIG. 28 hand 2 is frozen at a specific desired light intensity, so that said specific light intensity is chosen, and control is switched off.

Figure 29:
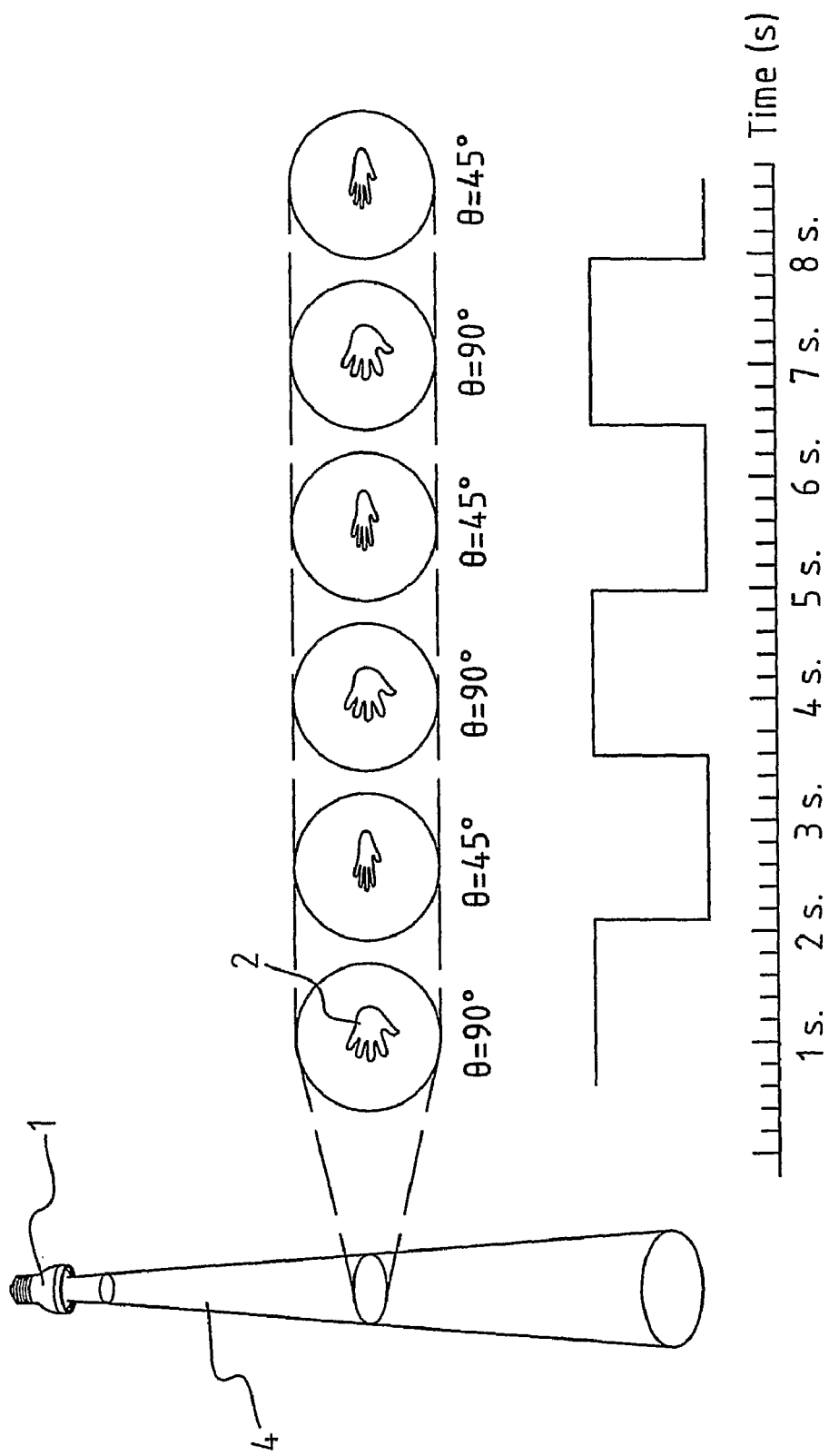
FIGS. 29 and 30 show schematically the movement of a hand in the beam and the related graph of the time-of-flight against time.

Switching from one basic control to another one can also be achieved by making a hand rotation. Therefore a certain angle between hand and ultrasonic beam has to be made (see FIG. 29). If the angle between hand and ultrasound bean cone is 90 degrees the maximum echo signal will be received by the ultrasound transceiver. If the hand makes an angle of 45 degrees with the ultrasound beam cone (almost) no echo signal will be received by the transceiver, because the echo signal will be reflected by the hand to another position. A certain unique profile can be chosen for selecting one of the basic controls in a menu, for example as shown in FIG. 29.

Figure 30:
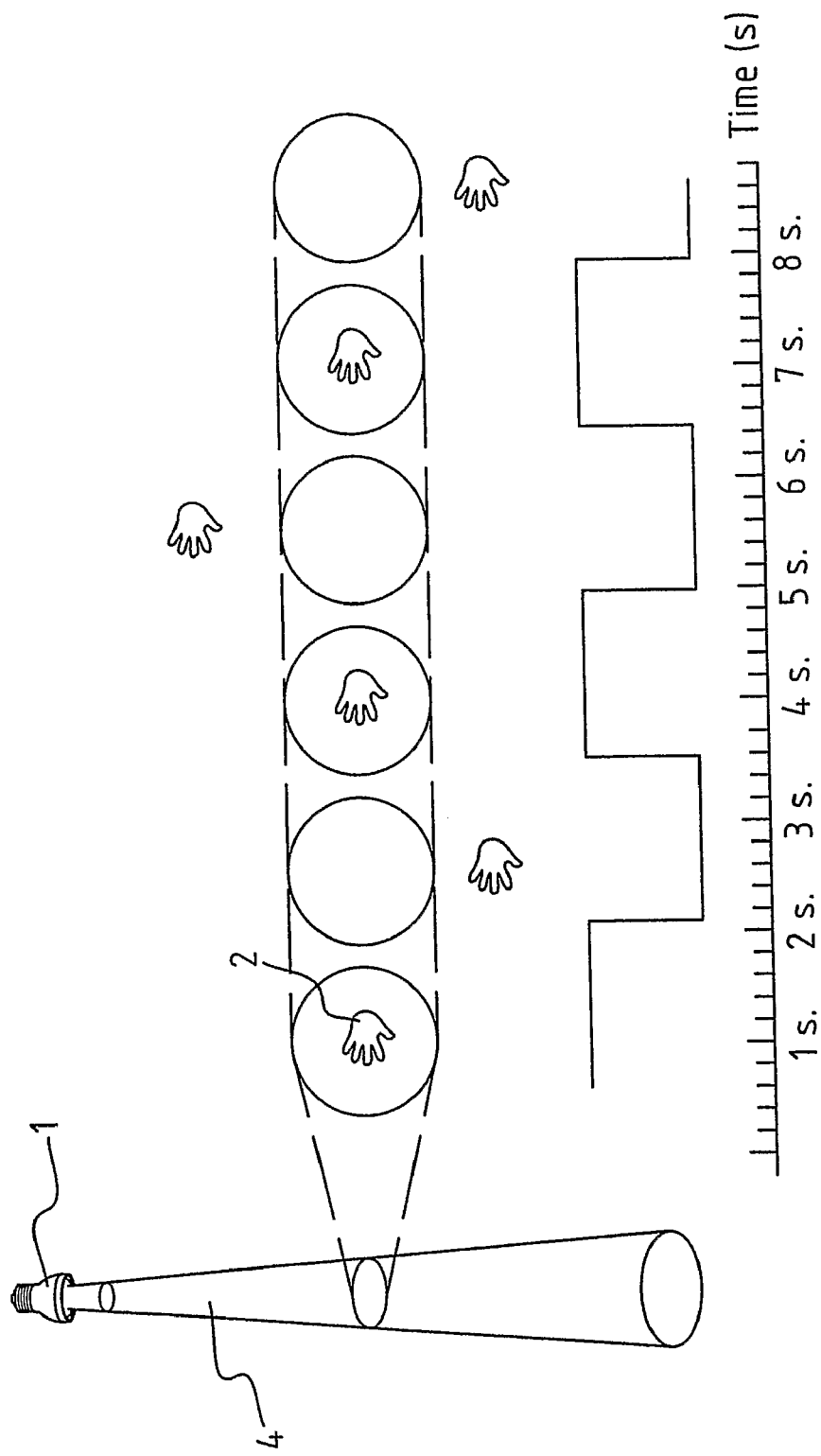

With this method the user can switch from one basic control to another one without the need to control each basic control. Stepping through the menu is done by another type of Selection of a basic light control can also be achieved by (horizontal) hand movements crossing the ultrasound beam cone, as illustrated in FIG. 30. The time-of-flight is measured with a high sample rate, and an alternating TOF signal (low-high-low, etcetera) is recognized as a unique profile, which can be chosen for selecting the basic controls in a menu.

In a light remote control system, before, during or after the user inputs light control instructions feedback or messages will be given to said user, comparable to TV applications where feedback is given via the display to the user during control of the basic functions like contrast, brightness, saturation, etcetera. For example if the light system does not receive the control signal, or the signal is too weak, a certain error messages to the user is desirable.

Depending of the used light control application like remote control, ultrasound or video based gesture light control, different feedback mechanisms are proposed.

In a menu controlled system changes have to be made visible for the user. Also when control is enabled feedback has to be given. If an error occurs also feedback has to be given to the user. Also different kinds of error messages can be given to the user or to a service environment for fast analyses and repair of the error.

The first proposed method for feedback to the user is messaging by light pulses, or flickering of light.

Eyes are very sensitive for light flicker until frequencies around 60 Hz. Flicker can be made by switching the light off and on again very fast. A alternative method to create light flicker is reducing light intensity for a very short moment in time and change it back to the original light intensity.

The second proposed method for feedback to the user is messaging by light colour changes or colour temperature changes. Different colours or colour temperature could give different messages to end-user. Also a combination of the first two methods can communicate extra information to the user.

Figure 31:
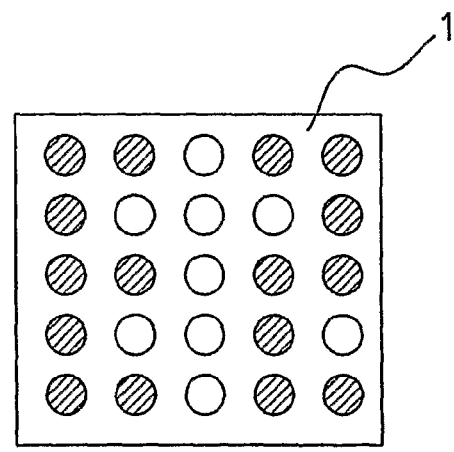
FIG. 31 schematically shows a LED array lamp showing a message.

The third proposed method is to make text feedback using a LED array lamp. By placing the LEDs in an array as shown in FIG. 31, array text messages can be formed. Also icons can be formed. FIG. 31 shows an example of a message text "E2", which could be a certain error message. In this manner the LED lamp is used as a display to send different text messages to the user or service department during an error situation.

Figure 32:
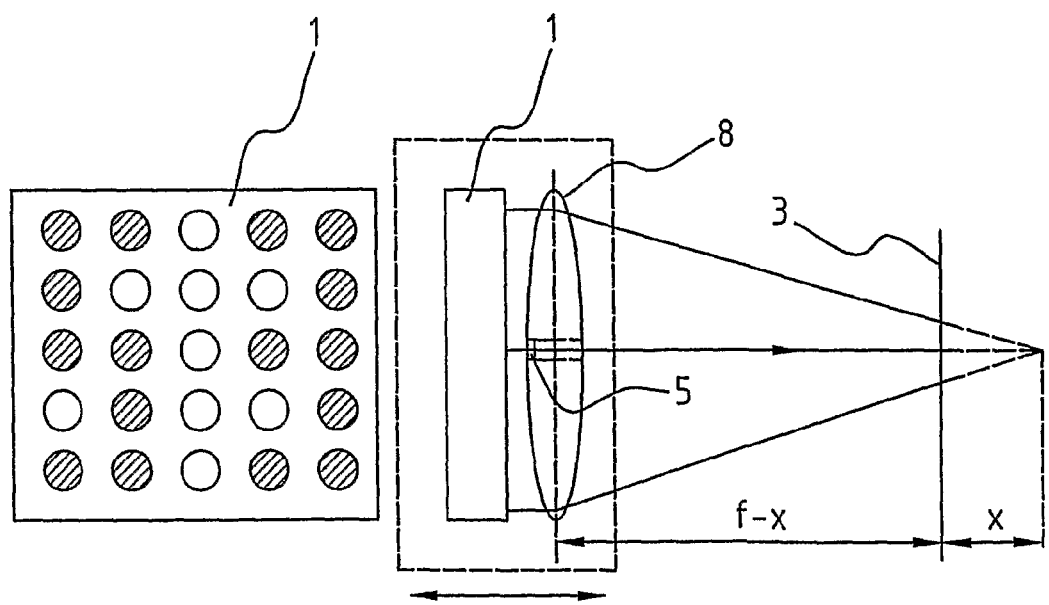
FIG. 32 schematically shows a LED array lamp projecting a message on a reference surface.

As shown in FIG. 32, the text of the LED array can also be projected by a lens 8 on an object surface (reference 3) like a table, a wall or floor. In an ultrasound based gesture light control system as described above the distance between the lens 8 and the object (the focal length f) by the TOF measurement of the ultrasound sensor 5 (here shown built in the lens 8) can be used. With this information the focal length can be adjusted as function of the distance with the object (automatic focus). For example a stepper motor can perform the adjustment of the focal length. The text of the lamp array has to be mirrored if a lens is used.

In order to reduce the costs of the lamp to a minimum and to have the possibility to control all possible lighting parameters like colour, intensity, etcetera, the electronic circuit needed for carrying out the control functions is integrated in the lamp. The microprocessor used for gesture control is also integrated in the LED control microprocessor to reduce the cost even more. The integration of the ultrasound sensor in the lamp makes low cost, high volume production possible.

Figure 33:
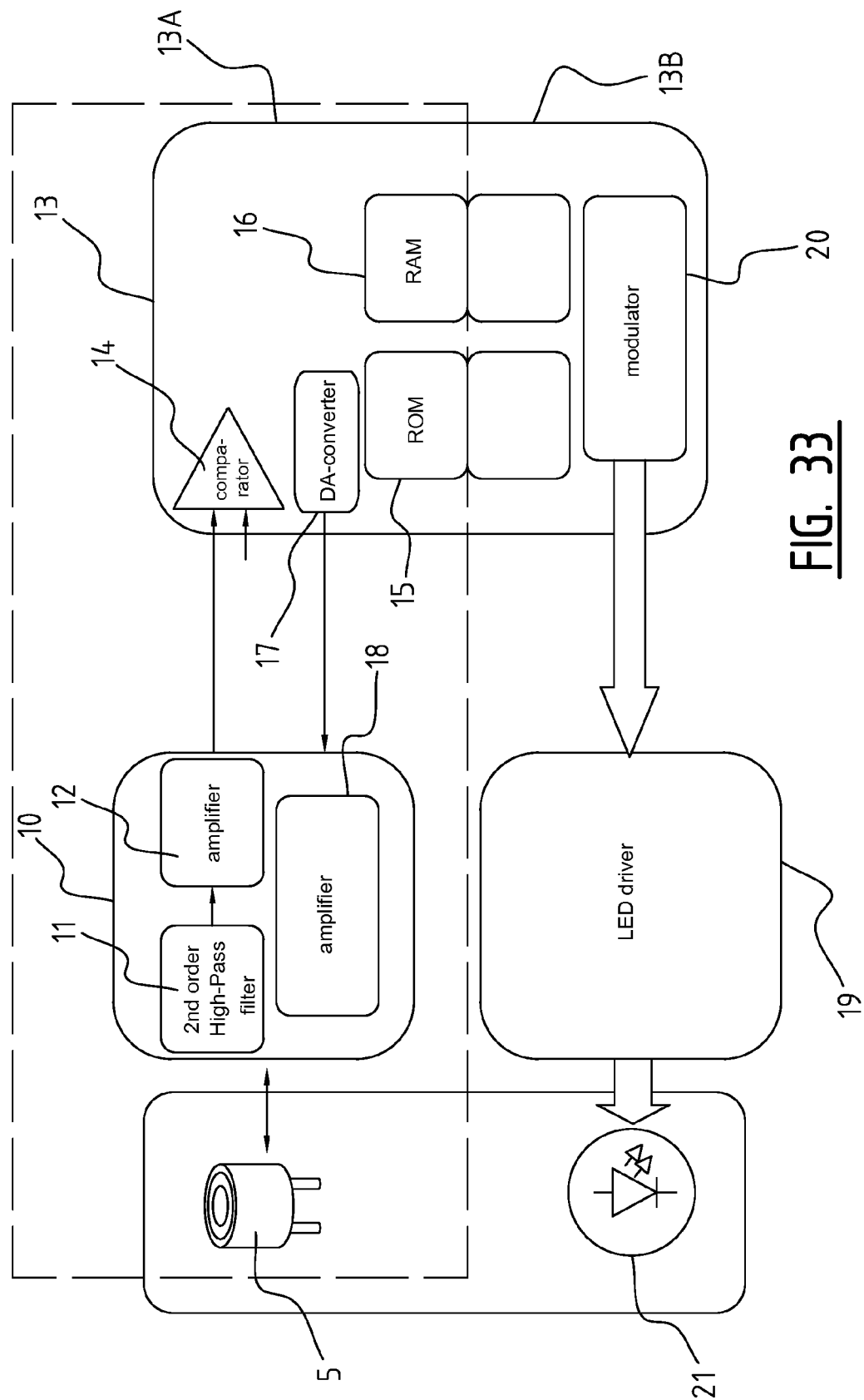
FIGS. 33 and 34 schematically show an electronic hardware implementation of the invention.
Figure 34:
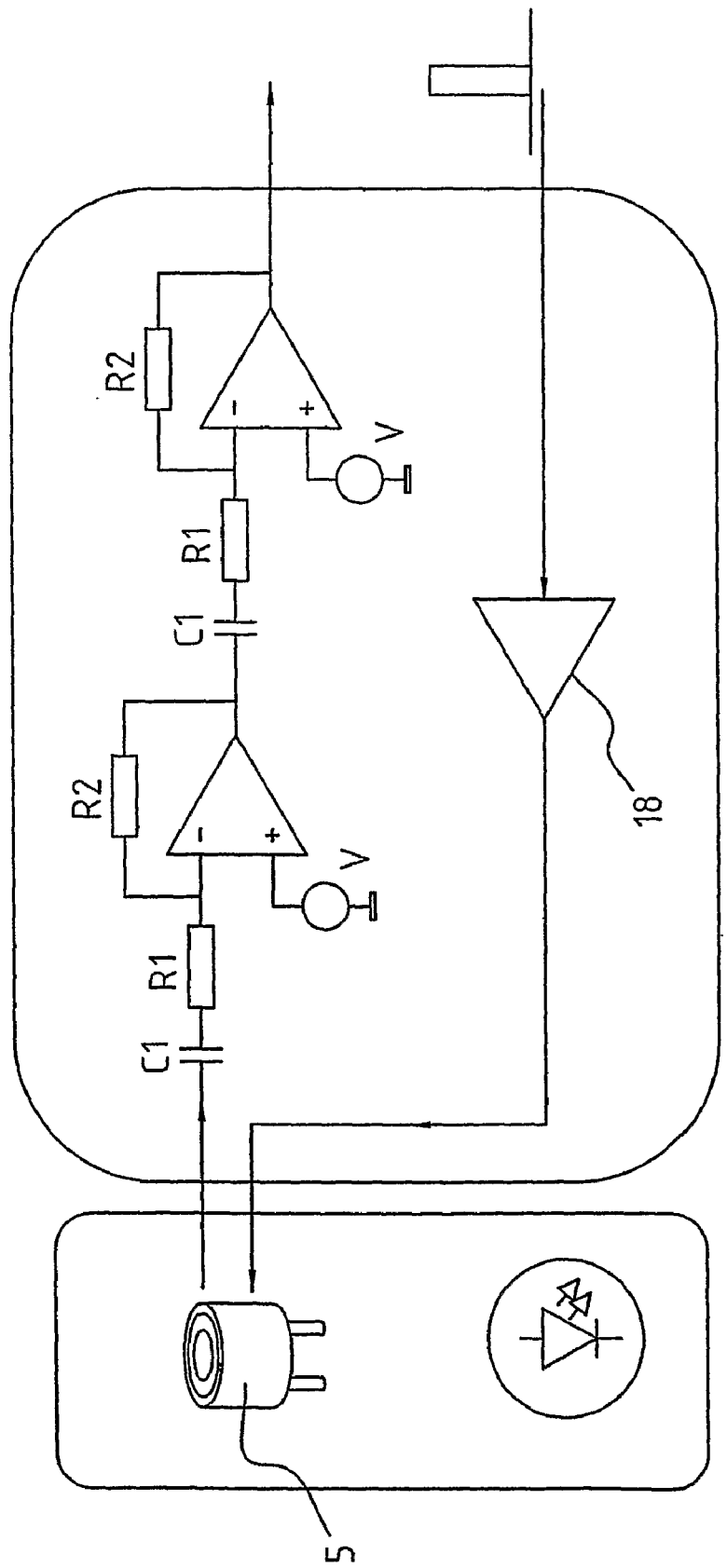

With reference to FIG. 33, as explained above the micro-controller sends a pulse to the ultrasound transmitter of the ultrasound transceiver 5. A digital pulse signal is generated by the control part 13A of a micro-controller 13, and converted by DA-converter 17 in said micro-controller 13 into an electric pulse. This pulse will be amplified by the amplifier 18 in the pre-processor 10 (shown in more detail in FIG. 34) to a value that can be used by the ultrasound transmitter part of the ultrasound transceiver 5. Then the piezo-electric ultrasound transceiver 5 sends an acoustic signal (for instance at a frequency of 40 kHz). An object will reflect this acoustic signal. The pre-processor 10 will receive the reflected signal via the ultrasound transducer 5. In order to reduce the influence of outside disturbances the signal is filtered by a 2nd order High-Pass filter 11 of for instance 20 kHz (=fc). After filtering the signal is amplified by amplifier 12 in the pre-processor 10.

Microcontroller 13 comprises a comparator 14, which creates a digital pulse signal from the electric signal received from the pre-processor 10, which can be processed by the micro-controller 13.

The micro-controller 13 further comprises a LED driver part 13B, with a modulator 20, which is connected to the LED driver 19, and part of the ROM 15 and the RAM 16, which is shared, with the control part 13A of the micro-controller.

Such a micro-controller 13, arranged to drive a LED, is well known in the art, but is further programmed to perform the control functions as described above. The micro-controller can be a simple processor, for instance of the 8051-family. The size of the ROM 15 can be as low as 2 kB and the size of the RAM 16 can be as low as 256 bytes.

Figure 35:
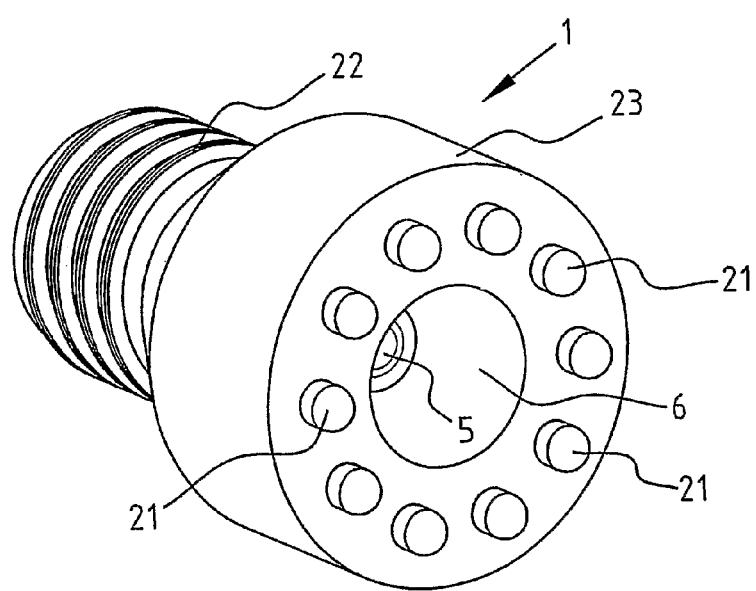
FIG. 35 is a perspective view of a lamp according to the invention.

FIG. 35 shows a lamp according to the invention comprising a housing with a standard incandescent lamp type fitting, ten LEDs 21 arranged in a circle, a transducer 5 in a horn 6. All the electronic components like the micro-controller 13, pre-processor 10 and LED driver 19 are built-in in the housing 23. Thereby a very compact lighting system is obtained, which requires no further external accessories to be operated and controlled.

Although the invention is described herein by way of preferred embodiments as example, the man skilled in the art will appreciate that many modifications and variations are possible within the scope of the invention.

What is claimed is:

1. A lighting system comprising:
   a lamp comprising an array of LEDs arranged to transform electricity into a light beam having properties including intensity, colour, colour temperature;
   a light control system comprising a LED driver and a pulse width modulator arranged to adjust said light beam properties;
   a DA-converter, an ultrasound driver and an ultrasonic transmitter arranged to convert a digital transmit signal into the transmission of an ultrasonic pulse;
   an ultrasonic receiver and an amplifier arranged to receive reflected ultrasonic signals and transform said ultrasonic signal in a voltage, and a comparator arranged to generate a digital receive signal if said voltage is greater than a predetermined threshold;
   a processing system arranged to derive a time-of-flight signal representing the time differences between said digital transmit and receive signals and to send control signals to said light control system in dependence of said time-of-flight signal,
   wherein said processing system, said pulse width modulator, said DA-converter and said comparator are integrated in a single microcontroller chip.

2. The lighting system of claim 1, wherein said microcontroller chip is chosen from the single-chip 8-bit 8051/80C51 microcontroller family.

3. The lighting system of claim 2, wherein said microcontroller chip comprises fewer than 4 kB ROM and fewer than 512 B RAM.

4. The lighting system of claim 1, wherein said ultrasonic transmitter and said ultrasonic receiver are integrated in a piezoelectric ultrasound transducer.

5. The lighting system of claim 1, wherein said transmitting ultrasound driver and said amplifier are integrated in a pre-processing circuit.

6. The lighting system of claim 5, wherein said pre-processing circuit further comprises a second order filter for filtering out low frequent signals from said received signal.

* * * * *